US009691822B2

(12) United States Patent
Kim et al.

(10) Patent No.: US 9,691,822 B2
(45) Date of Patent: Jun. 27, 2017

(54) ORGANIC LIGHT EMITTING DIODE DISPLAY AND MANUFACTURING METHOD THEREOF

(71) Applicant: SAMSUNG DISPLAY CO., LTD., Yongin, Gyeonggi-Do (KR)

(72) Inventors: Deuk Jong Kim, Cheonan-si (KR); Tak-Young Lee, Anyang-si (KR); Won Kyu Lee, Seoul (KR); Hae-Yeon Lee, Bucheon-si (KR); Ji Hye Kong, Seongnam-si (KR); Hyun Tae Kim, Cheonan-si (KR); Yong Sung Park, Seoul (KR); Yong Ho Yang, Suwon-si (KR); Dong-Beom Lee, Suwon-si (KR); Deok-Young Choi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 99 days.

(21) Appl. No.: 14/789,435

(22) Filed: Jul. 1, 2015

(65) Prior Publication Data
US 2016/0217743 A1    Jul. 28, 2016

(30) Foreign Application Priority Data

Jan. 23, 2015 (KR) .......................... 10-2015-0011562

(51) Int. Cl.
*G06F 3/038* (2013.01)
*H01L 27/28* (2006.01)
*H01L 27/12* (2006.01)
*H01L 27/32* (2006.01)
*G09G 3/3233* (2016.01)

(52) U.S. Cl.
CPC .............. *H01L 27/28* (2013.01); *H01L 27/12* (2013.01); *H01L 27/3276* (2013.01);
(Continued)

(58) Field of Classification Search
CPC combination set(s) only.
See application file for complete search history.

(56) References Cited

U.S. PATENT DOCUMENTS

2004/0253771 A1* 12/2004 Yamazaki ........... H01L 27/1237
438/149
2006/0049407 A1* 3/2006 Jung ....................... H01L 27/12
257/72
(Continued)

FOREIGN PATENT DOCUMENTS

KR       20-0309911 Y1    5/2003
KR    10-2004-0070914 A   8/2004
(Continued)

*Primary Examiner* — Jonathan Boyd
*Assistant Examiner* — Sosina Abebe
(74) *Attorney, Agent, or Firm* — Lewis Roca Rothgerber Christie LLP

(57) ABSTRACT

An organic light emitting diode display including: a substrate; a plurality of first signal lines on the substrate extending in a first direction; a first insulating layer covering the substrate and the first signal lines; a plurality of auxiliary signal lines formed on the first insulating layer and overlapping the first signal lines; a second insulating layer covering the auxiliary signal lines; a plurality of first signal line connecting members formed on the second insulating layer while overlapping parts of the auxiliary signal lines; a plurality of second signal lines crossing the first signal lines; a plurality of switching transistors and a plurality of driving transistors connected with the first signal lines and the second signal lines; and a plurality of organic light emitting diodes electrically connected to the driving transistors, where the first signal line connecting members connect the first signal lines to the auxiliary signal lines.

12 Claims, 17 Drawing Sheets

(52) U.S. Cl.
CPC ... *G09G 3/3233* (2013.01); *G09G 2300/0426* (2013.01); *G09G 2300/0819* (2013.01); *G09G 2300/0842* (2013.01); *G09G 2300/0861* (2013.01); *G09G 2310/0262* (2013.01); *G09G 2320/0238* (2013.01); *G09G 2320/043* (2013.01)

(56) References Cited

U.S. PATENT DOCUMENTS

| | | | | |
|---|---|---|---|---|
| 2006/0050192 | A1* | 3/2006 | Cho | G02F 1/136286 349/42 |
| 2007/0008445 | A1* | 1/2007 | Hur | H01L 27/1288 349/43 |
| 2008/0231576 | A1* | 9/2008 | Yamamoto | G09G 3/3233 345/90 |
| 2009/0256150 | A1* | 10/2009 | Yoon | H01L 27/0248 257/57 |
| 2009/0278128 | A1* | 11/2009 | Seong | H01L 27/1214 257/59 |
| 2015/0069391 | A1* | 3/2015 | Kanegae | H01L 27/3276 257/43 |

FOREIGN PATENT DOCUMENTS

| | | |
|---|---|---|
| KR | 10-0696584 B1 | 3/2007 |
| KR | 10-0796803 B1 | 1/2008 |
| KR | 10-2014-0018623 A | 2/2014 |
| KR | 10-2014-0053601 A | 5/2014 |
| KR | 10-2014-0053602 A | 5/2014 |

* cited by examiner

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2015-0011562 filed in the Korean Intellectual Property Office on Jan. 23, 2015, the entire contents of which are incorporated herein by reference.

BACKGROUND

1. Field

The present disclosure relates to an organic light emitting diode display and a manufacturing method thereof.

2. Description of the Related Art

An organic light emitting diode (OLD) display includes two electrodes and an organic light emission layer interposed therebetween. Electrons injected from a cathode that is one of the two electrode and holes injected from an anode that is the other electrode are bonded to each other in the organic light emission layer to form excitons, and light is emitted while the excitons discharge energy.

The organic light emitting diode display includes a plurality of pixels, each including an organic light emitting diode that is formed of a cathode, an anode, and an organic light emission layer, and a plurality of transistors and capacitors for driving the organic light emitting diode are formed in each pixel. Further, a plurality of signal lines for applying a signal to the plurality of transistors and capacitors is formed in each pixel.

In order to implement a high resolution structure, it is necessary to reduce resistance of the plurality of signal lines. When a scan line that is one of the plurality of signal lines is formed of molybdenum (Mo), the width of the scan line is made small in the high resolution structure, so that resistance of the scan line is increased. In this case, it is difficult to perform a full swing scan, resulting in an increase of horizontal line patterns or random spots.

In order to prevent the problem, the scan line may be formed of a low resistance material, such as aluminum (Al), but in this case, the scan line is vulnerable to a thermal processing process, so that it is impossible to perform a doping process by using the scan line as a mask and then perform a dopant activating process. As described above, it is difficult to develop a manufacturing process due to a problem with peripheral processes.

The above information disclosed in this Background section is only for enhancement of understanding of the background of the disclosure and therefore it may contain information that does not form the prior art that is already known in this country to a person of ordinary skill in the art.

SUMMARY

The present disclosure has been made in an effort to provide an organic light emitting diode display, which is capable of implementing a high resolution structure by reducing resistance of a signal line without adding a separate mask, and a manufacturing method thereof.

Some exemplary embodiments of the present disclosure provide an organic light emitting diode display, including: a substrate; a plurality of first signal lines formed on the substrate and extended in a first direction; a first insulating layer configured to cover the substrate and the plurality of first signal lines; a plurality of auxiliary signal lines formed on the first insulating layer and overlapping the plurality of first signal lines; a second insulating layer configured to cover the plurality of auxiliary signal lines; a plurality of first signal line connecting members formed on the second insulating layer and overlapping parts of the plurality of auxiliary signal lines; a plurality of second signal lines crossing the plurality of first signal lines; a plurality of switching transistors and a plurality of driving transistors connected to the plurality of first signal lines and the plurality of second signal lines; and a plurality of organic light emitting diodes electrically connected with the plurality of driving transistors, in which the plurality of first signal line connecting members connect the first signal lines to the auxiliary signal lines, respectively.

Each of the auxiliary signal lines may include an auxiliary opening overlapping a respective first signal line connecting member, the first insulating layer may include a plurality of first openings for exposing a part of the plurality of first signal lines, respectively, the second insulating layer may include a plurality of second openings for exposing a part of the plurality of auxiliary signal lines and the auxiliary openings, respectively, and each of the first signal line connecting members connects the respective first signal line to a respective auxiliary signal line through a respective first opening, a respective auxiliary opening, and a respective second opening.

A boundary line of the first opening may correspond to a boundary line of the auxiliary openings.

A diameter of each of the second openings may be larger than a diameter of each of the first openings.

Each of the second opening may expose the entire of the respective auxiliary opening.

The first signal lines and the auxiliary signal lines may be elongated in the same direction.

Each of the driving transistor may include: a driving channel formed on the substrate; a driving gate electrode formed on the driving channel and overlapping the driving channel; and a driving source electrode and a driving drain electrode positioned at both sides of the driving channel. The driving channel may be bent on a plane.

Each of the driving transistors may include: a storage capacitor including a first storage electrode formed on the same layer as that of the first signal lines; and a second storage electrode overlapping the first storage electrode and formed on the first insulating layer, in which the first storage electrode is a driving gate electrode.

Each of the first signal lines may include a scan line which is formed on the substrate and transmits a scan signal; a previous scan line which is disposed in parallel to the scan line to transmit a previous scan signal and formed on the same layer as that of the scan line; a light emission control line which is disposed in parallel to the scan line to transmit a light emission control signal, and formed on the same layer as that of the scan line; and a bypass control line which is disposed in parallel to the scan line to transmit a bypass control signal, and formed on the same layer as that of the scan line. Each of the auxiliary signal lines may include: an auxiliary scan line formed on the first insulating layer and overlapping the scan line; an auxiliary previous scan line formed on the first insulating layer and overlapping the previous scan line; an auxiliary light emission control line formed on the first insulating layer and overlapping the light emission control line; and an auxiliary bypass control line formed on the first insulating layer and overlapping the bypass control line.

Each of the first signal line connecting members may include a scan connecting member formed on the second insulating layer and overlapping a part of the respective auxiliary scan line; a previous scan connecting member formed on the second insulating layer and overlapping a part of the respective auxiliary previous scan line, a light emission control connecting member formed on the second insulating layer and overlapping a part of the respective auxiliary light emission control line; and a bypass control connecting member formed on the second insulating layer and overlapping a part of the respective auxiliary bypass control line. Also, each of the auxiliary openings includes: an auxiliary scan opening formed in the respective auxiliary scan line, an auxiliary previous scan opening formed in the respective auxiliary previous scan line, an auxiliary light emission control opening formed in the respective auxiliary light emission control line, and an auxiliary bypass control opening formed in the respective auxiliary bypass control line.

Each of the first openings may include a first scan opening for exposing a part of the scan line, a first scan opening for exposing a part of the scan line; a first previous scan opening for exposing a part of the respective previous scan line; a first light emission control opening for exposing a part of the respective light emission control line; and a first bypass control opening for exposing a part of the respective bypass control line, and wherein each of the second openings includes: a second scan opening for exposing the respective auxiliary scan opening; a second previous scan opening for exposing the respective auxiliary previous scan opening; a second light emission control opening for exposing the respective auxiliary light emission control opening, and a second bypass opening for exposing the respective auxiliary bypass control opening.

Each of the auxiliary signal lines may include a first auxiliary signal line and a second auxiliary signal line separated from each other by a spacing part, the first insulating layer may include a first opening for exposing a part of the first signal line, the second insulating layer may include a second opening for exposing the spacing part between an end of the first auxiliary signal line and an end of the second auxiliary signal line, and the first signal line connecting member may connect the first signal line and the auxiliary signal line to each other through the first opening, the spacing part, and the second opening.

Another exemplary embodiment of the present disclosure provides a method of manufacturing an organic light emitting diode display including: forming a plurality of first signal lines on a substrate; forming a first insulating layer for covering the substrate and the plurality of first signal lines; forming a plurality of auxiliary signal lines, which overlaps the plurality of first signal lines and includes auxiliary openings, respectively, on the first insulating layer; forming a second insulating layer for covering the plurality of auxiliary signal lines; forming first openings in the first insulating layer and second openings in the second insulating layer by etching the first insulating layer and the second insulating layer at the same time using the auxiliary openings; forming a plurality of first signal line connecting members, which overlaps parts of the plurality of auxiliary signal lines, respectively, on the second insulating layer; forming a plurality of second signal lines crossing the plurality of first signal lines, respectively; and forming an organic light emitting diode in which a respective one of the plurality of first signal lines and a respective one of the plurality of second signal lines are electrically connected.

Each of the first signal line connecting members may connect a respective first signal line and a respective auxiliary signal line to each other through a respective first opening, a respective auxiliary opening, and a respective second opening.

Each of the first openings may expose a part of a respective first signal line, and each of the second openings exposes a part of a respective auxiliary signal line and a respective auxiliary opening.

A boundary line of each of the first openings may correspond to a boundary line of a respective auxiliary opening.

The plurality of second signal lines may be formed on the same layer as that of the plurality of first signal line connecting members.

According to the exemplary embodiments of the present disclosure, it is possible to reduce resistance of the first signal lines by forming the auxiliary signal lines overlapping the first signal lines, and connecting the first signal lines and the auxiliary signal lines by using the first signal line connecting members. Accordingly, it is possible to easily implement a high resolution structure.

Further, it is possible to simultaneously form the first openings and the second openings by simultaneously etching the first insulating layer and the second insulating layer by forming the auxiliary openings overlapping the first signal line connecting members and the signal lines in the auxiliary signal lines. Accordingly, it is possible to reduce resistance of the first signal lines by connecting the first signal lines and the auxiliary signal lines through the first openings, the auxiliary openings, and the second openings without addition of a separate mask.

Further, each of the auxiliary signal lines may be divided into the first auxiliary signal line and the second auxiliary signal line by the spacing part, and the spacing part may overlap the first signal line connecting member and the first signal line, so that it is possible to simultaneously form the first opening and the second opening by simultaneously etching the first insulating layer and the second insulating layer. Accordingly, it is possible to reduce resistance of each of the first signal lines by connecting each of the first signal lines and the respective auxiliary signal lines through the respective first openings, the respective spacing parts, and the respective second openings, without addition of a separate mask.

Further, it is possible to minimize a space required for connecting each of the first signal lines and the respective auxiliary signal lines to each other by forming all of the first signal lines, the auxiliary signal lines, and the first signal line connection members to overlap one another, thereby easily implementing a high resolution structure.

DETAILED DESCRIPTION

Figure 1:
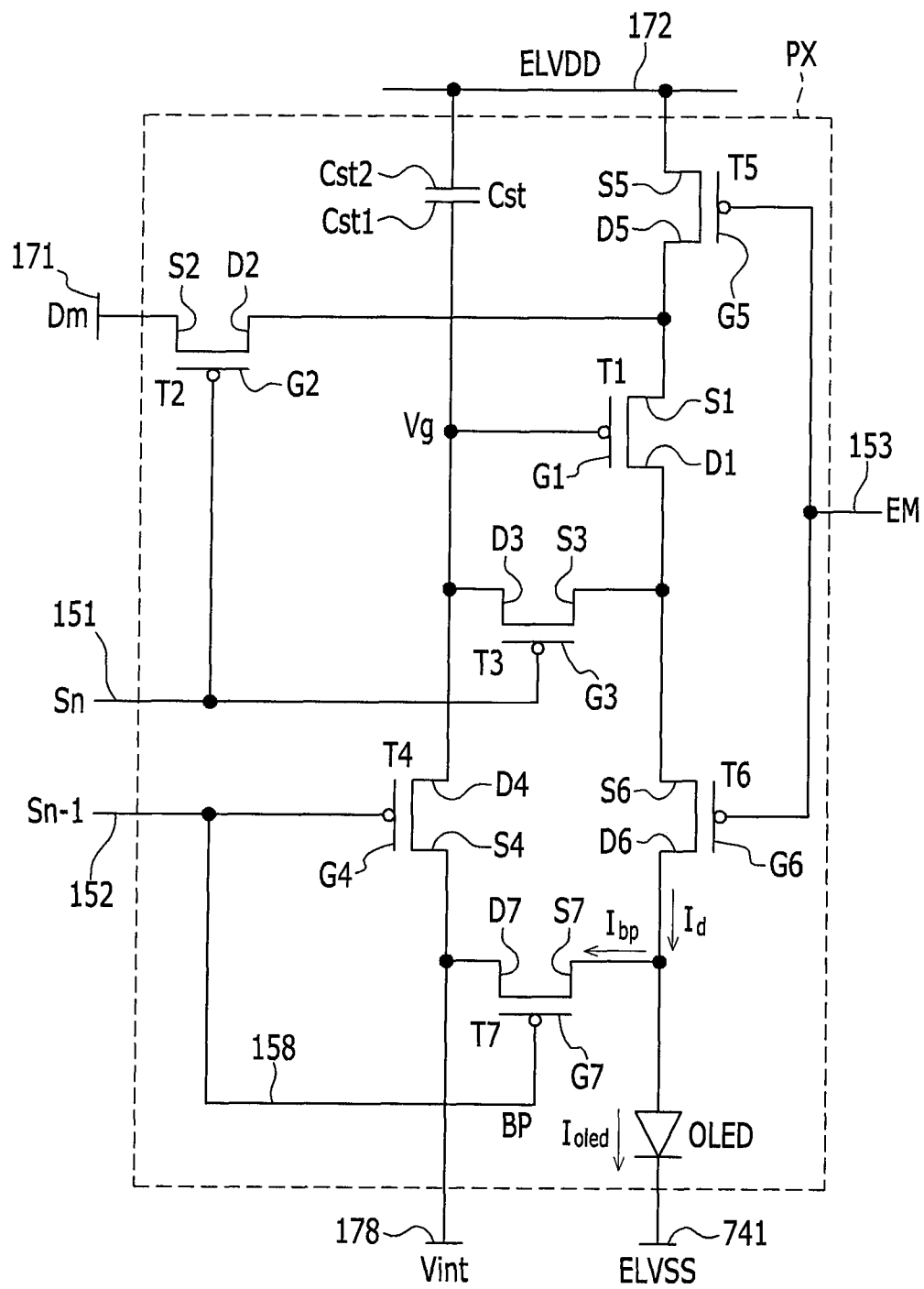
FIG. 1 is an equivalent circuit diagram of one pixel of an organic light emitting diode display according to an exemplary embodiment of the present disclosure.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure.

In describing the present disclosure, parts that are not related to the description will be omitted. Like reference numerals generally designate like elements throughout the specification.

In addition, the size and thickness of each configuration shown in the drawings are arbitrarily shown for understanding and ease of description, but the present disclosure is not limited thereto. In the drawings, the thickness of layers, films, panels, regions, etc., are exaggerated for clarity. In the drawings, for convenience of the description, thicknesses of some layers and areas are exaggerated.

In addition, unless explicitly described to the contrary, the word "comprise" and variations such as "comprises" or "comprising", will be understood to imply the inclusion of stated elements but not the exclusion of any other elements. Further, throughout the specification, it will be understood that when an element such as a layer, film, region, or substrate is referred to as being "on" another element, it can be directly on the other element or intervening elements may also be present. Further, the word "over" or "on" means positioning on or below the object portion, but does not essentially mean positioning on the upper side of the object portion based on a gravity direction.

Further, the present disclosure is not limited to the number of thin film transistors TFT and capacitors illustrated in the accompanying drawings, and the organic light emitting diode display may include a plurality of thin film transistors and one or more capacitors in one pixel, and a separate wire may be further formed or a known wire may be omitted to provide various structures. Here, the pixel means a minimum unit displaying an image, and the organic light emitting diode display displays an image through a plurality of pixels.

Further, throughout the specification, the term "according to a plane" means a case where a target portion is viewed from the above, and the term "according to a cross section" means a case where a cross section taken by vertically cutting a target portion is viewed from the side.

An organic light emitting diode display according to an exemplary embodiment of the present disclosure will be described in detail with reference to the accompanying drawings.

FIG. 1 is an equivalent circuit diagram of one pixel of an organic light emitting diode display according to an exemplary embodiment of the present disclosure.

An organic light emitting diode display according to an exemplary embodiment of the present disclosure includes a plurality of signal lines 151, 152, 153, 158, 171, 172, and 178, and a plurality of pixels PX connected to the plurality of signal lines 151, 152, 153, 158, 171, 172, and 178 and approximately arranged in a matrix form.

One pixel PX includes a plurality of transistors T1, T2, T3, T4, T5, T6, and T7 connected to the plurality of signal lines 151, 152, 153, 158, 171, 172, and 178, a storage capacitor Cst, and an organic light emitting diode OLD.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 178 include first signal lines 151, 152, 153, and 158 elongated in a row direction that is a first direction, and second signal lines 171, 172, and 178 crossing the first signal lines and elongated in a column direction that is a second direction. The first signal lines 151, 152, 153, and 158 includes a scan line 151 for transmitting a scan signal Sn to the compensation transistor T3, a previous scan line 152 for transmitting a previous scan signal Sn-1 to the initialization transistor T4, a light emission control line 153 for transmitting a light emission control signal EM to the operation control transistor T5 and the light emission control transistor T6, and a bypass control line 158 for transmitting a bypass signal BP to the bypass transistor T7. The second signal lines 171, 172, and 178 include a data line 171 crossing the scan line 151 and transmitting a data signal Dm, a driving voltage line 172 for transmitting a driving voltage ELVDD and formed in almost parallel to the data line 171, and an initialization voltage line 178 for transmitting an initialization voltage Vint for initializing the driving transistor T1.

A gate electrode G1 of the driving transistor T1 is connected to one end Cst1 of the storage capacitor Cst, a source electrode S1 of the driving transistor T1 is connected to the driving voltage line 172 via the operation control transistor T5, and a drain electrode D1 of the driving transistor T1 is electrically connected to an anode of the organic light emitting diode OLD via the light emission control transistor T6. The driving transistor T1 receives the data signal Dm according to a switching operation of the switching transistor T2 to supply a driving current Id to the organic light emitting diode OLD.

A gate electrode G2 of the switching transistor T2 is connected to the scan line 151, a source electrode S2 of the switching transistor T2 is connected to the data line 171, and a drain electrode D2 of the switching transistor T2 is connected to the driving voltage line 172 via the operation control transistor T5 while being connected to the source electrode S1 of the driving transistor T1. The switching transistor T2 is turned on according to the scan signal Sn received through the scan line 151 to perform the switching operation of transmitting the data signal Dm transmitted to the data line 171 to the source electrode S1 of the driving transistor T1.

A gate electrode G3 of the compensation transistor T3 is connected to the scan line 151, a source electrode S3 of the compensation transistor T3 is connected to an anode of the organic light emitting diode OLD via the light emission control transistor T6 while being connected to the drain electrode D1 of the driving transistor T1, and a drain electrode D3 of the compensation transistor T3 is connected to all of a drain electrode D4 of the initialization transistor T4, the one end Cst1 of the storage capacitor Cst, and the gate electrode G1 of the driving transistor T1. The compensation transistor T3 is turned on according to the scan signal Sn received through the scan line 151 to diode-connect the driving transistor T1 by connecting the gate electrode G1 and the drain electrode D1 of the driving transistor T1 to each other.

A gate electrode G4 of the initialization transistor T4 is connected to the previous scan line 152, a source electrode S4 of the initialization transistor T4 is connected to the initialization voltage line 178, and a drain electrode D4 of the initialization transistor T4 is connected to all of the one end Cst1 of the storage capacitor Cst and the gate electrode G1 of the driving transistor T1 via the drain electrode D3 of the compensation transistor T3. The initialization transistor T4 is turned on according to the previous scan signal Sn-1 received through the previous scan line 152 to transmit the initialization voltage Vint to the gate electrode G1 of the driving transistor T1, and perform an initialization operation of initializing a gate voltage Vg of the gate electrode G1 of the driving transistor T1.

A gate electrode G5 of the operation control transistor T5 is connected to the light emission control line 153, a source electrode S5 of the operation control transistor T5 is connected to the driving voltage line 172, and a drain electrode D5 of the operation control transistor T5 is connected to the source electrode S1 of the driving transistor T1 and the drain electrode D2 of the switching transistor T2.

A gate electrode G6 of the light emission control transistor T6 is connected to the light emission control line 153, a source electrode S6 of the light emission control transistor T6 is connected to the drain electrode D1 of the driving transistor T1 and the source electrode S3 of the compensation transistor T3, and a drain electrode D6 of the light emission control transistor T6 is electrically connected to the anode of the organic light emitting diode OLD. The operation control transistor T5 and the light emission control transistor T6 are simultaneously turned on according to the light emission control signal EM received through the light emission control line 153, and thus the driving voltage ELVDD is compensated through the diode-connected driving transistor T1 and transmitted to the organic light emitting diode OLD.

A gate electrode G7 of the bypass transistor T7 is connected to the bypass control line 158, a source electrode S7 of the bypass transistor T7 is connected to both the drain electrode D6 of the light emission control transistor T6 and the anode of the organic light emitting diode OLD, and a drain electrode D7 of the bypass transistor T7 is connected to the initialization voltage line 178 and the source electrode S4 of the initialization transistor T4 together. Here, the bypass control line 158 is connected to the previous scan line 152, so that the bypass signal BP is the same as the previous scan signal Sn-1.

The other end Cst2 of the storage capacitor Cst is connected to the driving voltage line 172, and a cathode of the organic light emitting diode OLD is connected to a common voltage line 741 transmitting a common voltage ELVSS.

In the meantime, in the exemplary embodiment of the present disclosure, the seven transistor and one capacitor structure including the bypass transistor T7 is illustrated, but the present disclosure is not limited thereto, and the number of transistors and the number of capacitors may be various changed.

Hereinafter, a detailed operation process of one pixel of the organic light emitting diode display according to the exemplary embodiment of the present disclosure will be described with reference to FIGS. 1 and 2.

Figure 2:
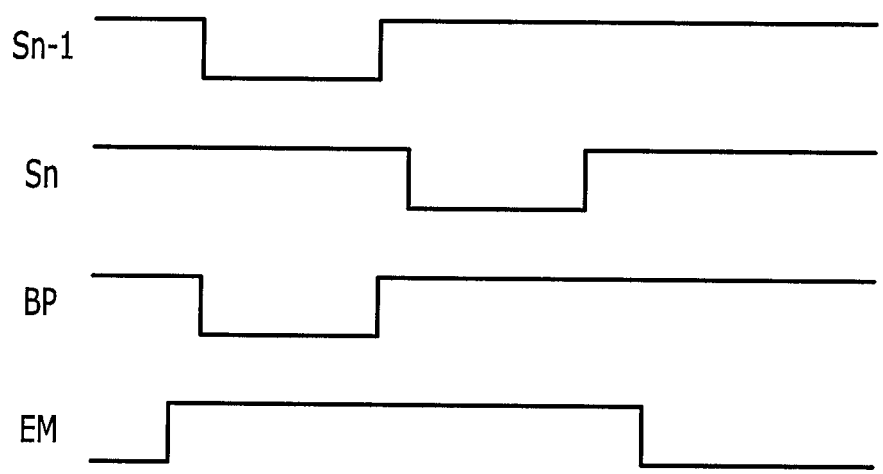
FIG. 2 is a timing diagram of a signal applied to one pixel of the organic light emitting diode display according to the exemplary embodiment of the present disclosure.

FIG. 2 is a timing diagram of a signal applied to one pixel of the organic light emitting diode display according to the exemplary embodiment of the present disclosure.

As illustrated in FIG. 2, the previous scan signal Sn-1 of a low level is supplied through the previous scan line 152 for an initialization period. Then, the initialization transistor T4 is turned on in response to the previous scan signal Sn-1 of the low level, the initialization voltage Vint transmitted from the initialization voltage line 178 through the initialization transistor T4 is connected to the gate electrode G1 of the driving transistor T1, and the driving transistor T1 is initialized by the initialization voltage Vint.

Subsequently, the scan signal Sn of the low level is supplied through the scan line 151 during a data programming period. Then, the switching transistor T2 and the compensation transistor T3 are turned on in response to the scan signal Sn dropping to a low level. In this case, the driving transistor T1 is diode-connected by the turned-on compensation transistor T3, and is biased in a forward direction.

Then, a compensation voltage Dm+Vth (Vth is a negative value) obtained by subtracting a threshold voltage Vth of the driving transistor T1 from the data signal Dm supplied from the data line 171 is applied to the gate electrode G1 of the driving transistor T1. That is, the gate voltage Vg applied to the gate electrode G1 of the driving transistor T1 is the compensation voltage Dm+Vth. The driving voltage ELVDD and the compensation voltage Dm+Vth are applied to both ends of the storage capacitor Cst, and a charge corresponding to the difference in the voltage between both ends is stored in the storage capacitor Cst.

Then, the light emission control signal EM supplied from the light emission control line 153 during the light emission period is changed from a high level to the low level. Then, the operation control transistor T5 and the light emission control transistor T6 are turned on by the light emission control signal EM of the low level during the light emission period.

Then, the driving current $I_d$ is generated according to a difference between the gate voltage Vg of the gate electrode G1 of the driving transistor T1 and the driving voltage ELVDD, and the driving current $I_d$ is supplied to the organic light emitting diode OLD through the light emission control transistor T6. A driving gate-source voltage Vgs of the driving transistor T1 is maintained at "(Dm+Vth)−ELVDD" by the storage capacitor Cst during the light emission period, and the driving current $I_d$ is proportional to a square of a value obtained by subtracting the threshold voltage Vth from the driving source-gate voltage Vgs, that is, "(Dm−ELVDD)$^2$", according to a current-voltage relationship of the driving transistor T1. Accordingly, the driving current $I_d$ is determined regardless of the threshold voltage Vth of the driving transistor T1.

In this case, the bypass transistor T7 receives the bypass signal BP from the bypass control line 158.

The bypass transistor T7 is turned on based on the bypass signal BP from the bypass control line 158. Thus, the portion of the driving current $I_d$ is discharged as the bypass current $I_{bp}$ through the bypass transistor T7.

When the organic light emitting diode OLD emits light even when a minimum current of the driving transistor T1 displaying a black image flows as a driving current, a black image is not properly displayed. Accordingly, the bypass transistor T7 of the organic light emitting diode display according to the exemplary embodiment of the present disclosure may disperse a portion of the minimum current of the driving transistor T1 to a current path other than the current path of the organic light emitting diode side as a bypass current $I_{bp}$. Herein, the minimum current of the driving transistor T1 means a current under the condition where the gate-source voltage Vgs of the driving transistor T1 is smaller than the threshold voltage Vth, so that the driving transistor T1 is turned off. The minimum driving current (for example, a current of 10 pA or less) under the condition where the driving transistor T1 is turned off is transmitted to the organic light emitting diode OLD to be displayed as an image of black luminance. When the minimum driving current displaying the black image flows, a bypass transmission effect of the bypass current $I_{bp}$ is large, but when the large driving current displaying an image, such as a general image or a white image, flows, an effect of the bypass current $I_{bp}$ is little. Accordingly, when the driving current displaying the black image flows, a light emitting current $I_{old}$ of the organic light emitting diode OLD, which is reduced by a current amount of the bypass current $I_{bp}$ discharged from the driving current $I_d$ through the bypass transistor T7, has a minimum current amount at a level at which the black image may be clearly displayed. Accordingly, a contrast ratio may be improved by implementing a precise black luminance image by using the bypass transistor T7. In FIG. 1, the bypass signal BP is the same as the previous scan signal Sn-1, but is not limited thereto.

Hereinafter, a detailed structure of the organic light emitting diode display according to the exemplary embodiment of the present disclosure will be described in detail with reference to FIGS. 3, 4, 5, 6, and 7.

Figure 3:
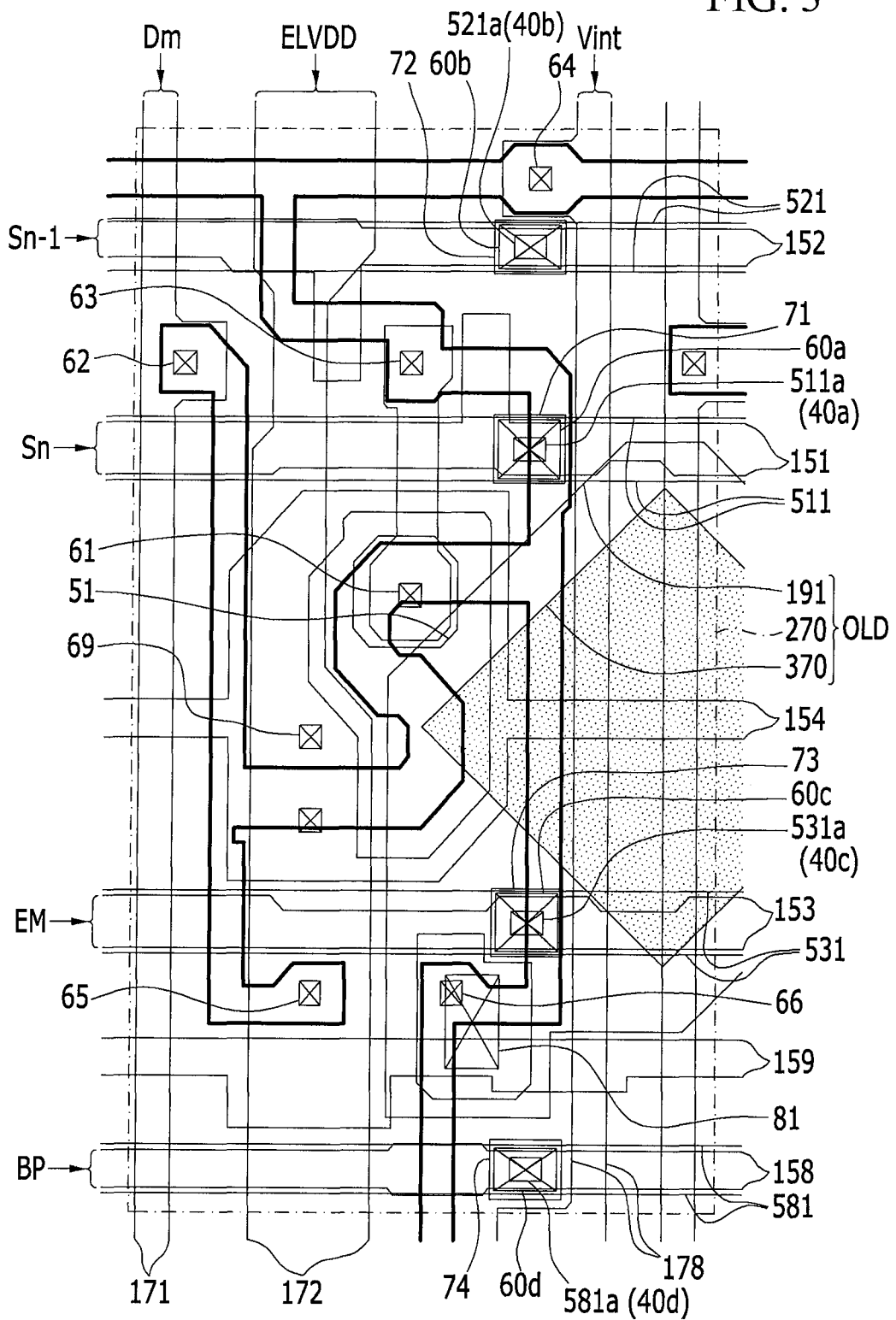
FIG. 3 is a diagram schematically illustrating a plurality of transistors and capacitors of the organic light emitting diode display according to the exemplary embodiment of the present disclosure.
Figure 4:
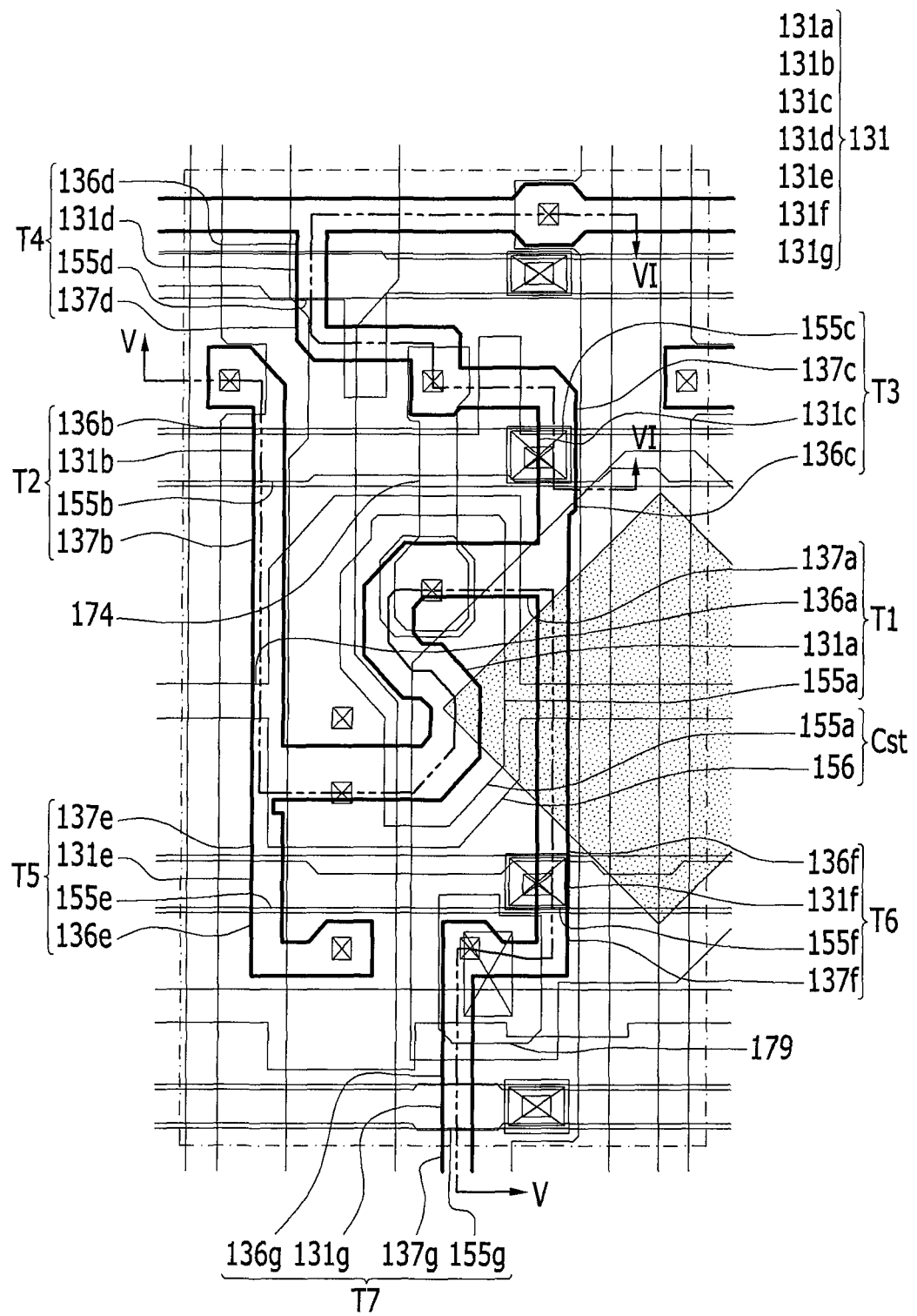
FIG. 4 is a detailed layout view of FIG. 3.
Figure 5:
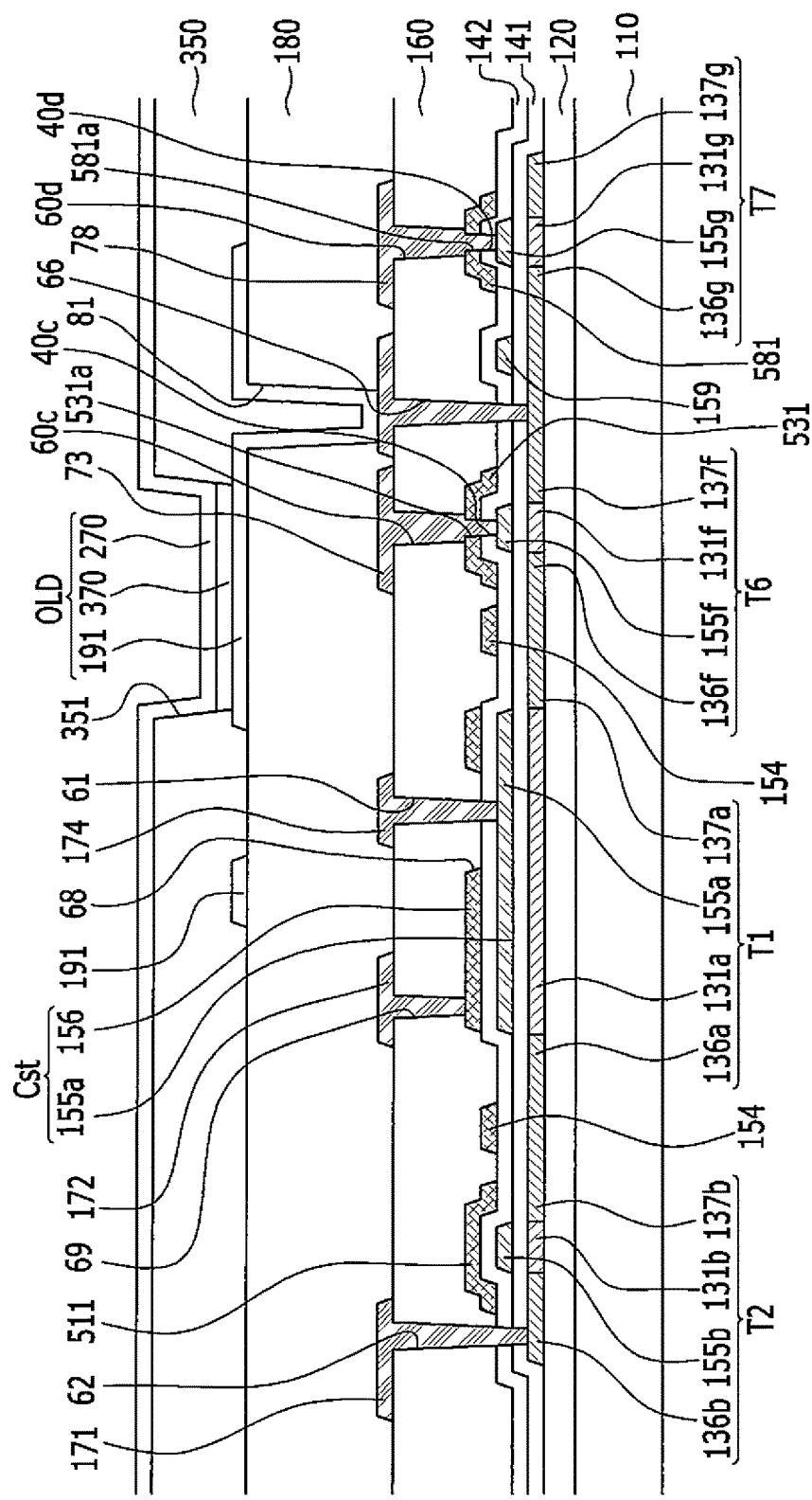
FIG. 5 is a cross-sectional view taken along line V-V of the organic light emitting diode display of FIG. 4.
Figure 6:
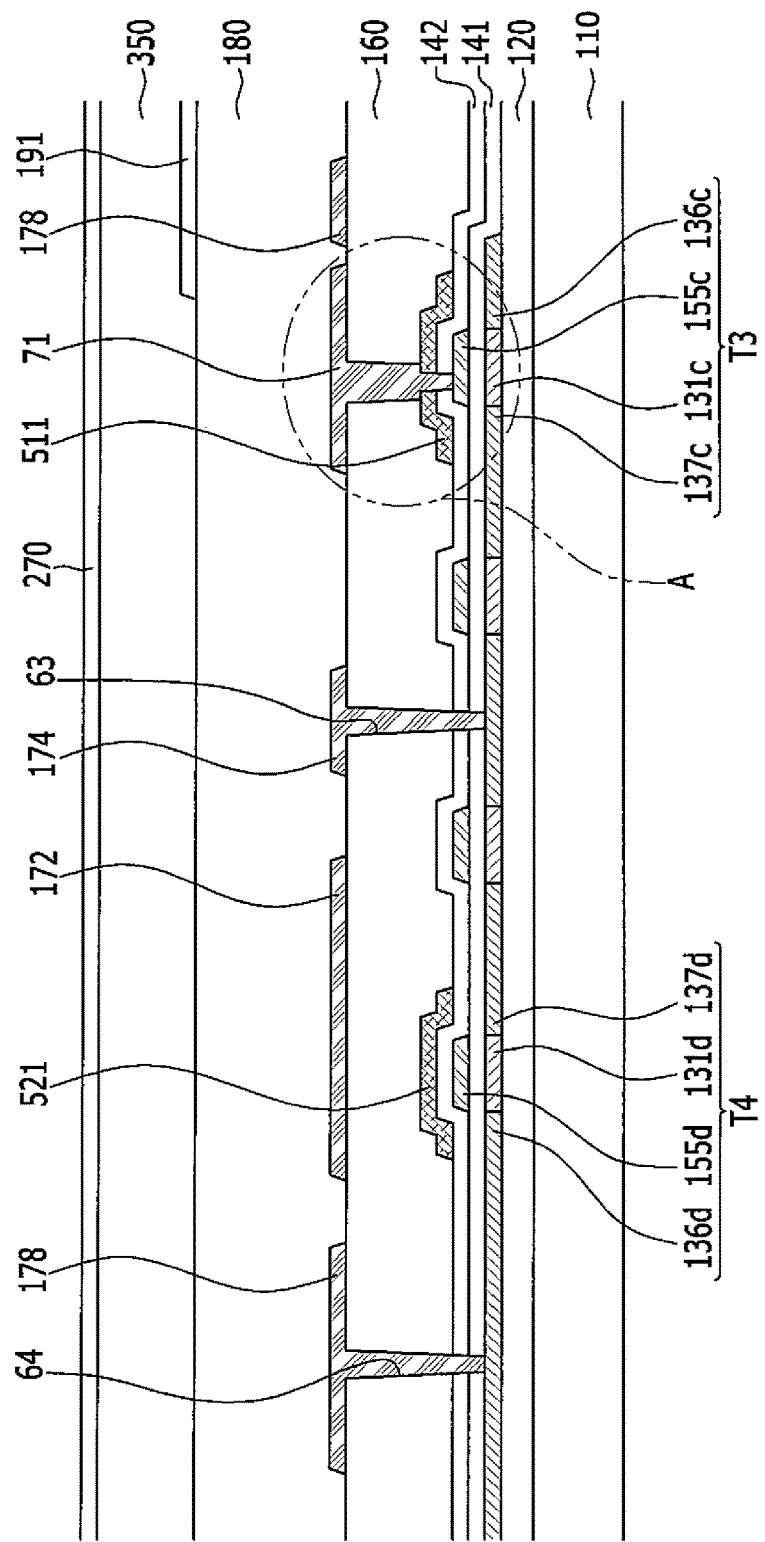
FIG. 6 is a cross-sectional view taken along line VI-VI of the organic light emitting diode display of FIG. 4.
Figure 7:
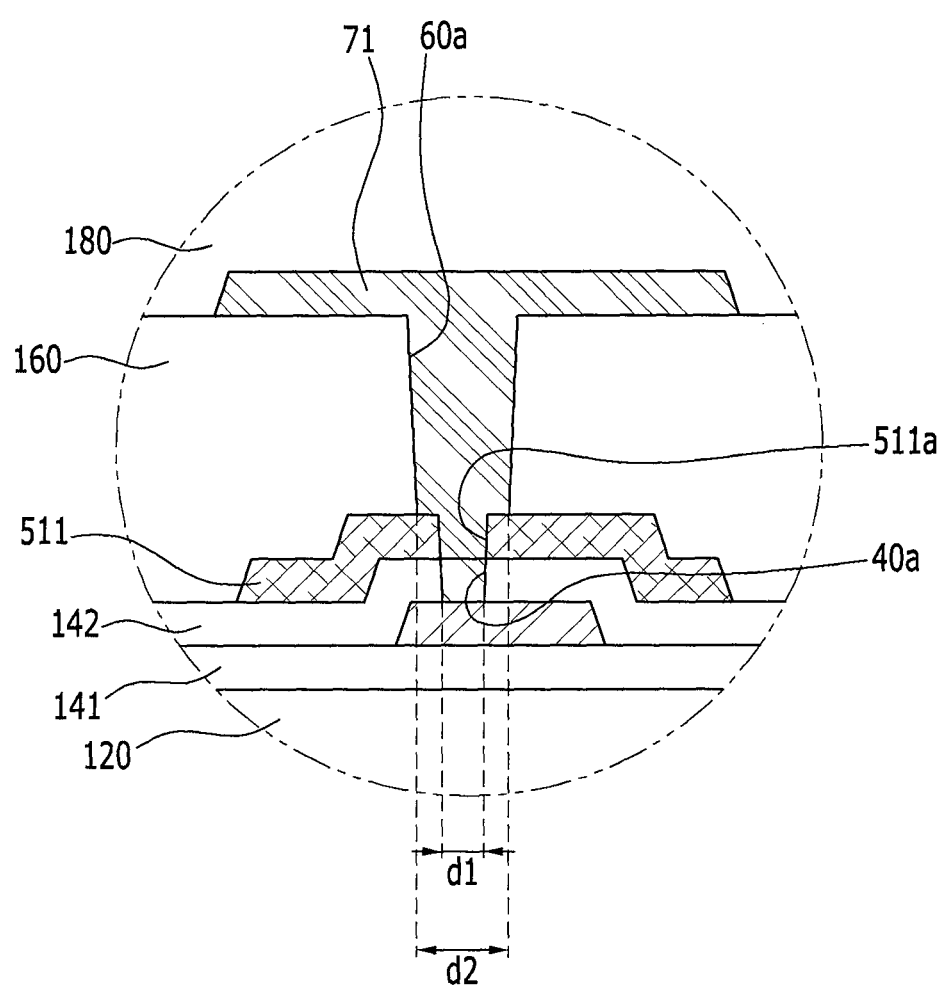
FIG. 7 is an enlarged cross-sectional view of part A of FIG. 6.

FIG. 3 is a diagram schematically illustrating a plurality of transistors and capacitors of the organic light emitting diode display according to the exemplary embodiment of the present disclosure, FIG. 4 is a detailed layout view of FIG. 3, FIG. 5 is a cross-sectional view taken along line V-V of the organic light emitting diode display of FIG. 4, FIG. 6 is a cross-sectional view taken along line VI-VI of the organic light emitting diode display of FIG. 4, and FIG. 7 is an enlarged cross-sectional view of part A of FIG. 6.

Hereinafter, a detailed plan structure of the organic light emitting diode display according to the exemplary embodiment of the present disclosure will be first described with reference to FIGS. 3 and 4, and a detailed cross-sectional structure of the organic light emitting diode display according to the exemplary embodiment of the present disclosure will be described with reference to FIGS. 5, 6, and 7.

First, as illustrated in FIG. 3, the first signal lines 151, 152, 153, and 158 of the organic light emitting diode display according to the exemplary embodiment of the present disclosure include the scan line 151, the previous scan line 152, the light emission control line 153, and the bypass control line 158 for applying the scan signal Sn, the previous scan signal Sn-1, the light emission control signal EM, and the bypass signal BP, respectively, and formed in the row direction. In this case, a repair line 159 for repairing is disposed in parallel to the scan line 151.

Further, the organic light emitting diode display according to the exemplary embodiment of the present disclosure includes auxiliary signal lines 511, 521, 531, and 581 overlapping the first signal lines 151, 152, 153, and 158. The auxiliary signal lines 511, 521, 531, and 581 include an auxiliary scan line 511, an auxiliary previous scan line 521, an auxiliary light emission control line 531, and an auxiliary bypass control line 581 overlapping the scan line 151, the previous scan line 152, the light emission control line 153, and the bypass control line 158, respectively. The auxiliary scan line 511 is elongated in the row direction that is the same direction as an extension direction of the scan line 151, the auxiliary previous scan line 521 is elongated in the row direction that is the same direction as an extension direction of the previous scan line 152, the auxiliary light emission control line 531 is extended in the row direction that is the same direction as an extension direction of the light emission control line 153, and the auxiliary bypass control line 581 is elongated in the row direction that is the same direction as an extension direction of the bypass control line 158. The auxiliary scan line 511 includes an auxiliary scan opening 511a, the auxiliary previous scan line 521 includes an auxiliary previous scan opening 521a, the auxiliary light emission control line 531 includes an auxiliary light emission control opening 531a, and the auxiliary bypass control line 581 includes an auxiliary bypass control opening 581a.

Further, the organic light emitting diode display according to the exemplary embodiment of the present disclosure includes the data line 171, the driving voltage line 172, and the initialization voltage line 178 crossing the scan line 151, the previous scan line 152, the light emission control line 153, and the bypass control line 158, and apply the data signal Dm, the driving voltage ELVDD, and the initialization voltage Vint to the pixel PX, respectively. In this case, the initialization voltage Vint is transmitted from the initialization voltage line 178 to the compensation transistor T3 via the initialization transistor T4.

Further, the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode OLD are formed in the pixel PX. The organic light emitting diode OLD is formed of a pixel electrode 191, a organic light emission layer 370, and a common electrode 270. In this case, the compensation transistor T3 and the initialization transistor T4 are configured of a transistor having a dual gate structure for blocking a current leakage.

The channel of each of the driving transistor T1, the switching transistor T2, the compensation transistor T3, the initialization transistor T4, the operation control transistor T5, the light emission control transistor T6, and the bypass transistor T7 is formed inside one connected semiconductor 130, and the semiconductor 130 may be formed to be curved in various forms. The semiconductor 130 may be formed of polysilicon or an oxide semiconductor. The oxide semiconductor may include any one of oxides having titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as an indium-gallium-zinc oxide (InGaZnO$_4$), indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O). When the semiconductor 130 is formed of the oxide semiconductor, a separate passivation layer may be added in order to protect the oxide semiconductor which is weak to an external environment, such as a high temperature environment.

The semiconductor 130 includes a channel which is doped with an N-type impurity or a P-type impurity, and a source doping area and a drain doping area formed at both sides of the channel and having a higher doping concentration than that of the doping impurity doped in the channel. In the present exemplary embodiment, the source doping area and the drain doping area correspond to a source electrode and a drain electrode, respectively. The source electrode and the drain electrode formed in the semiconductor 130 may be formed by doping only the corresponding areas. Further, an area between the source electrode and the drain electrode of different transistors in the semiconductor 130 is also doped, so that the source electrode and the drain electrode may be electrically connected with each other.

As illustrated in FIG. 4, the channel 131 formed in the semiconductor 130 includes a driving channel 131a formed in the driving transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 includes the driving channel 131a, a driving gate electrode 155a, a driving source electrode 136a, and a driving drain electrode 137a. The driving channel 131a may be bent, and may have an meandering shape or a zigzag shape. As described above, the driving channel 131a is formed in the bent shape, so that it is possible to elongated driving channel 131a within a narrow space. Accordingly, a driving range of the driving gate-source voltage Vgs between the driving gate electrode 155a and the driving source electrode 136a is widened by the elongated driving channel 131a. Therefore, since the driving range of the driving gate-source voltage Vgs is widened, a ray of light emitted from an organic light emitting diode OLD may be more finely controlled by changing a size of the gate voltage Vg applied to the driving gate electrode 155a. As a result, it is possible to increase resolution of the organic light emitting diode display and improve a display quality. Various exemplary embodiments, such as a shape of "inverse S", a shape of "S", a shape of "M", and a shape of "W", of the driving channel 131a may be carried out by variously changing the shape of the driving channel 131a.

The driving gate electrode 155a overlaps the driving channel 131a, and the driving source electrode 136a and the driving drain electrode 137a are formed while being adjacent to both sides of the driving channel 131a, respectively. The driving gate electrode 155a is connected with a driving connecting member 174 through a contact hole 61.

The switching transistor T2 includes the switching channel 131b, a switching gate electrode 155b, a switching source electrode 136b, and a switching drain electrode 137b. The switching gate electrode 155b that is a part expanded from the scan line 151 downwardly overlaps the switching channel 131b, and the switching source electrode 136b and the switching drain electrode 137b are formed while being adjacent to both sides of the switching channel 131b, respectively. The switching source electrode 136b is connected with the data line 171 through a contact hole 62.

The compensation transistor T3 includes the compensation channel 131c, a compensation gate electrode 155c, a compensation source electrode 136c, and a compensation drain electrode 137c.

Two compensation gate electrodes 155c are formed in order to prevent a current leakage, and the two compensation gate electrodes 155c may be a part of the scan line 151 and a protrusion extended from the scan line 151 upwardly, respectively. The compensation gate electrode 155c overlaps the compensation channel 131c, and the compensation source electrode 136c and the compensation drain electrode 137c are formed while being adjacent to both sides of the compensation channel 131c. The compensation drain electrode 137c is connected with the driving connecting member 174 through a contact hole 63.

The initialization transistor T4 includes the initialization channel 131d, an initialization gate electrode 155d, an initialization source electrode 136d, and an initialization drain electrode 137d. Two initialization gate electrodes 155d are formed in order to prevent a current leakage, and the two initialization gate electrodes 155d may be a part of the previous scan line 152 and a protrusion extended from the previous scan line 152 downwardly, respectively. The initialization gate electrode 155d overlaps the initialization channel 131d, and the initialization source electrode 136d and the initialization drain electrode 137d are formed while being adjacent to both sides of the initialization channel 131d. The initialization source electrode 136d is connected with the initialization voltage line 178 through a contact hole 64, and the initialization drain electrode 137d is connected with the driving connecting member 174 through the contact hole 63.

The operation control transistor T5 includes the operation control channel 131e, an operation control gate electrode 155e, an operation control source electrode 136e, and an operation control drain electrode 137e. The operation control gate electrode 155e that is a part of the light emission control line 153 overlaps the operation control channel 131e, and the operation control source electrode 136e and the operation control drain electrode 137e are formed while being adjacent to both sides of the operation control channel 131e, respectively. The operation control source electrode 136e is connected with a part of the driving voltage line 172 through a contact hole 65.

The light emission control transistor T6 includes the light emission control channel 131f, a light emission control gate electrode 155f, a light emission control source electrode 136f, and a light emission control drain electrode 137f. The light emission control gate electrode 155f that is a part of the light emission control line 153 overlaps the light emission control channel 131f, and the light emission control source electrode 136f and the light emission control drain electrode 137f are formed while being adjacent to both sides of the light emission control channel 131f, respectively. The light emission control drain electrode 137f is connected with a light emission control connecting member 179 through a contact hole 66.

The bypass transistor T7 includes the bypass channel 131g, a bypass gate electrode 155g, a bypass source electrode 136g, and a bypass drain electrode 137g. The bypass gate electrode 155g that is a part of the bypass control line 158 overlaps the bypass channel 131g, and the bypass source electrode 136g and the bypass drain electrode 137g are formed while being adjacent to both sides of the bypass channel 131g. The bypass source electrode 136g is connected with the light emission control connecting member 179 through a contact hole 81, and the bypass drain electrode 137g is directly connected with the initialization source electrode 136d.

One end of the driving channel 131a of the driving transistor T1 is connected to the switching drain electrode 137b and the operation control drain electrode 137e, and the other end of the driving channel 131a is connected to the compensation source electrode 136c and the light emission control source electrode 136f.

The storage capacitor Cst includes a first storage electrode 155a and a second storage electrode 156 with a second gate insulating layer 142 interposed therebetween. The first storage electrode 155a corresponds to the driving gate electrode 155a, and the second storage electrode 156 is a part expanded from the storage line 154, and occupies a wider area than that of the driving gate electrode 155a and covers all of the driving gate electrode 155a. Here, the second gate insulating layer 142 becomes a dielectric material, and storage capacitance is determined by charges accumulated in the storage capacitor Cst and a voltage between both electrodes 155a and 156. As described above, the driving gate electrode 155a is used as the first storage electrode 155a, so that it is possible to secure a space in which the storage capacitor may be formed in a space, which is decreased due to the driving channel 131a occupying a large area within the pixel.

The first storage electrode 155a that is the driving gate electrode 155a is connected with one end of the driving connection member 174 through the contact hole 61 and the storage opening 51. The storage opening 51 is an opening formed in the second storage electrode 156.

The driving connecting member 174 is formed on the same layer as that of the data line 171 while being almost parallel to the data line 171, and the other end of the driving connecting member 174 is connected with the compensation drain electrode 137c of the compensation transistor T3 and the initialization drain electrode 137d of the initialization transistor T4 through the contact hole 63. Accordingly, the driving connecting member 174 connects the driving gate electrode 155a and the compensation drain electrode 137c of the compensation transistor T3 and the initialization drain electrode 137d of the initialization transistor T4.

The second storage electrode 156 is connected with the driving voltage line 172 through a contact hole 69.

Accordingly, the storage capacitor Cst stores storage capacitance corresponding to a difference between the driving voltage ELVDD transmitted to the second storage electrode 156 through the driving voltage line 172 and the gate voltage Vg of the driving gate electrode 155a.

The initialization voltage line 178 extended to be parallel to the data line 171 is connected with the initialization source electrode 176d through the contact hole 64, and the quadrangular light emission control connecting member 179 is connected with the pixel electrode 191 through the contact hole 81.

First signal line connecting members 71, 72, 73, and 78 for connecting the first signal lines 151, 152, 153, 158 and the auxiliary signal lines 511, 521, 531, and 581 are formed at positions at which the first signal line connecting members 71, 72, 73, and 78 overlap parts of the first signal lines 151, 152, 153, 158 and the auxiliary signal lines 511, 521, 531, and 581. This will be described in detail below.

The quadrangular scan connecting member 71 overlaps parts of the scan line 151 and the auxiliary scan line 511, and particularly, overlaps the auxiliary scan opening 511a of the auxiliary scan line 511. The scan connecting member 71 connects the scan line 151 and the auxiliary scan line 511 through the auxiliary scan opening 511a. The previous scan connecting member 72 overlaps parts of the previous scan line 152 and the auxiliary previous scan line 521, and particularly, overlaps the auxiliary previous scan opening 521a of the auxiliary previous scan line 521. The previous scan connecting member 72 connects the previous scan line 152 and the auxiliary previous scan line 521 through the auxiliary previous scan opening 521a. Similarly, the light emission control connecting member 73 overlaps the light emission control line 153 and the auxiliary light emission control opening 531a of the auxiliary light emission control line 531, so that the light emission control connecting member 73 connects the light emission control line 153 and the auxiliary light emission control line 531 through the auxiliary light emission control opening 531a, and the bypass control connecting member 78 overlaps the bypass control line 158 and the auxiliary bypass control opening 581a of the auxiliary bypass control line 581, so that the bypass control connecting member 78 connects the bypass control line 158 and the auxiliary bypass control line 581 through the auxiliary bypass control opening 581a.

As described above, the auxiliary signal lines 511, 521, 531, and 581 overlapping the first signal lines 151, 152, 153, and 158 may be formed, and the auxiliary signal lines 511, 521, 531, and 581 and the first signal lines 151, 152, 153, and 158 may be connected by using the first signal line connecting members 71, 72, 73, and 78, thereby reducing resistance of the first signal lines 151, 152, 153, and 158. Accordingly, it is possible to easily implement a high resolution structure.

Hereinafter, a stack sequence for a cross-sectional structure of the organic light emitting diode display according to the exemplary embodiment of the present disclosure will be described in detail with reference to FIGS. 5, 6, and 7.

In this case, a stack structure of the operation control transistor T5 is mostly the same as that of the light emission control transistor T6, so that a detailed description thereof will be omitted.

A buffer layer 120 is formed on a substrate 110. The substrate 110 may be formed of an insulating substrate made of glass, quartz, ceramic, plastic, and the like. The buffer layer 120 may serve to improve a characteristic of polycrystalline silicon and reduce stress applied to the substrate 110 by blocking impurities from the substrate 110 during a crystallization process of forming polysilicon.

The semiconductor 130 including the driving channel 131a, the switching channel 131b, the compensation channel 131c, the initialization channel 131d, the operation control channel 131e, the light emission control channel 131f, and the bypass channel 131g is formed on the buffer layer 120. In the semiconductor 130, the driving source electrode 136a and the driving drain electrode 137a are respectively formed at both sides of the driving channel 131a, and the switching source electrode 136b and the switching drain electrode 137b are respectively formed at both sides of the switching channel 131b. Further, the compensation source electrode 136c and the compensation drain electrode 137c are respectively formed at both sides of the compensation channel 131c, and the initialization source electrode 136d and the initialization drain electrode 137d are respectively formed at both sides of the initialization channel 131d. Further, the operation control source electrode 136e and the operation control drain electrode 137e are respectively formed at both sides of the operation control channel 131e, and the light emission control source electrode 136f and the light emission control drain electrode 137f are respectively formed at both sides of the light emission control channel 131f. Further, the bypass source electrode 136g and the bypass drain electrode 137g are respectively formed at both sides of the bypass channel 131g.

A first gate insulating layer 141 for covering the semiconductor 130 is formed on the semiconductor 130. First gate wires 151, 152, 153, 155a, and 158 including the scan line 151 including the switching gate electrode 155b and the compensation gate electrode 155c, the previous scan line 152 including the initialization gate electrode 155d, the light emission control line 153 including the operation control gate electrode 155e and the light emission control gate electrode 155f, the bypass control line 158 including the bypass gate electrode 155g, and the driving gate electrode (first storage electrode) 155a are formed on the first gate insulating layer 141.

The first gate wires 151, 152, 153, 155a, and 158 may be formed of a multilayer in which a metal layer including any one of copper (Cu), a copper alloy, aluminum (Al), an aluminum alloy, molybdenum (Mo), and a molybdenum alloy is stacked.

The second gate insulating layer 142 that is a first insulating layer covering the first gate wires 151, 152, 153, 155a, and 158 and the first gate insulating layer 141 is formed on the first gate wires 151, 152, 153, 155a, and 158 and the first gate insulating layer 141. First openings 40a, 40b, 40c, and 40d including a first scan opening 40a for exposing a part of the scan line 151, a first previous scan opening 40b for exposing a part of the previous scan line 152, a first light emission control opening 40c for exposing a part of the light emission control line 153, and a first bypass control opening 40d for exposing a part of the bypass control line 158 are formed in the second gate insulating layer 142. The first gate insulating layer 141 and the second gate insulating layer 142 may be formed of a silicon nitride (SiNx) or a silicon oxide (SiO$_2$).

Second gate wires 511, 521, 531, 581, 154, 156, and 159 including the auxiliary scan line 511 overlapping the scan line 151, the auxiliary previous scan line 521 overlapping the previous scan line 152, the auxiliary light emission control line 531 overlapping the light emission control line 153, the auxiliary bypass control line 581 overlapping the bypass control line 158, the storage line 154 disposed to be parallel to the scan line 151, the second storage electrode 156 that is the part expanded from the storage line 154, and the repair line 159 disposed to be parallel to the scan line 151 are formed on the second gate insulating layer 142.

The auxiliary signal lines 511, 521, 531, and 581 include the auxiliary openings 511a, 521a, 531a, and 581a. That is, the auxiliary scan line 511 includes the auxiliary scan opening 511a at a position at which the auxiliary scan line 511 overlaps the scan connecting member 71, the auxiliary previous scan line 521 includes the auxiliary previous scan opening 521a at a position at which the auxiliary previous scan line 521 overlaps the previous scan connecting member 72, the auxiliary light emission control line 531 includes the auxiliary light emission control opening 531a at a position at which the auxiliary light emission control line 531 overlaps the light emission control connecting member 73, and the auxiliary bypass control line 581 includes the auxiliary bypass control opening 581a at a position at which the auxiliary bypass control line 581 overlaps the bypass control connecting member 78.

In this case, a boundary line of the first scan opening 40a corresponds to a boundary line of the auxiliary scan opening 511a, a boundary line of the first previous scan opening 40b corresponds to a boundary line of the auxiliary previous scan opening 521a, a boundary line of the first light emission control opening 40c corresponds to a boundary line of the auxiliary light emission control opening 531a, and a boundary line of the first bypass control opening 40d corresponds to a boundary line of the auxiliary bypass control opening 581a. The reason is that the first openings 40a, 40b, 40c, and 40d are simultaneously formed with the auxiliary openings 511a, 521a, 531a, and 581a during the same etching process.

An interlayer insulating layer 160 that is a second insulating layer is formed on the second gate insulating layer 142 and the second gate wires 511, 521, 531, 581, 154, 156, and 159.

The contact holes 61, 62, 63, 64, 65, 66, and 69 and second openings 60a, 60b, 60c, and 60d are formed in the interlayer insulating layer 160. That is, the second openings 60a, 60b, 60c, and 60d including a second scan opening 60a for exposing a part of the auxiliary scan line 511 and the entire auxiliary scan opening 511a, a second previous scan opening 60b for exposing a part of the auxiliary previous scan line 521 and the entire auxiliary previous scan opening 521a, a second light emitting control opening 60c for exposing a part of the auxiliary light emission control line 531 and the entire auxiliary light emission control opening 531a, and a second bypass control opening 60d for exposing a part of the auxiliary bypass control line 581 and the entire auxiliary bypass control opening 581a in the interlayer insulating layer 160.

Diameters of the second openings 60a, 60b, 60c, 60d may be larger than those of the first openings 40a, 40b, 40c, and 40d. That is, a diameter of the second scan opening 60a is larger than that of the first scan opening 40a, a diameter of the second previous scan opening 60b is larger than that of the first previous scan opening 40b, a diameter of the second light emission control opening 60c is larger than that of the first light emission control opening 40c, and a diameter of the second bypass control opening 60d is larger than that of the first bypass control opening 40d.

The interlayer insulating layer 160 may be formed of a silicon nitride (SiNx) or a silicon oxide (SiO$_2$).

The data wires 171, 172, 174, 178, 179, 71, 72, 73, and 78 including the data line 171, the driving voltage line 172, the driving connecting member 174, the initialization voltage line 178, the light emission control connecting member 179, and the first signal line connecting members 71, 72, 73, and 78 are formed on the interlayer insulating layer 160.

The data line 171 is connected with the switching source electrode 136b through the contact hole 62, which is formed in the first gate insulating layer 141, the second gate insulating layer 142, and the interlayer insulating layer 160 while having the same boundary line, one end of the driving connecting member 174 is connected with the first storage electrode 155a through the contact hole 61, which is formed in the second gate insulating layer 142 and the interlayer insulating layer 160 while having the same boundary line, and the other end of the driving connecting member 174 is connected with the compensation drain electrode 137c and the initialization drain electrode 137d through the contact hole 63, which is formed in the first gate insulating layer 141, the second gate insulating layer 142, and the interlayer insulating layer 160 while having the same boundary line.

The initialization voltage line 178 is connected with the initialization source electrode 136d through the contact hole 64 formed in the first gate insulating layer 141, the second gate insulating layer 142, and the interlayer insulating layer 160.

Further, the light emission control connecting member 179 is connected with the light emission control drain electrode 137f through the contact hole 66 formed in the first gate insulating layer 141, the second gate insulating layer 142, and the interlayer insulating layer 160.

The first signal line connecting members 71, 72, 73, 78 connect the first signal lines 151, 152, 153, and 158 and the auxiliary signal lines 511, 521, 531, and 581 through the second openings 60a, 60b, 60c, and 60d formed in the interlayer insulating layer 160, the auxiliary openings 511a, 521a, 531a, and 581a formed in the auxiliary signal lines 511a, 521a, 531a, and 581a, and the first openings 40a, 40b, 40c, and 40d formed in the second gate insulating layer 142. In this case, diameters d2 of the second openings 60a, 60b, 60c, and 60d are larger than diameters d1 of the first openings 40a, 40b, 40c, and 40d. Also, the boundary lines of the auxiliary openings 511a, 521a, 531a, and 581a correspond to the boundary lines of the first openings 40a, 40b, 40c, and 40d, so that the first signal line connecting members 71, 72, 73, and 78 are formed in a step-shape to have an excellent step coverage.

The data wires 171, 172, 174, 178, and 179 may be formed of triple layers of titanium/aluminum/titanium (Ti/Al/Ti), molybdenum/aluminum/molybdenum (Mo/Al/Mo), or molybdenum/copper/molybdenum (Mo/Cu/Mo).

A passivation layer 180 is formed on the data wires 171, 172, 174, 178, and 179 and the interlayer insulating layer 160. The passivation layer 180 may be formed of an organic layer.

The pixel electrode 191 is formed on the passivation layer 180. The light emission control connecting member 179 is connected with the pixel electrode 191 through the contact hole 81 formed in the passivation layer 180.

A pixel defined layer (PDL) 350 covering the passivation layer 180 and the pixel electrode 191 is formed on edges of the passivation layer 180 and the pixel electrode 191, and the pixel defined layer 350 includes a pixel opening 351 for exposing the pixel electrode 191. The pixel defined layer 350 may be made of an organic material, such as polyacrylates resin and polyimides resin, or a silica-based inorganic material.

An organic light emission layer 370 is formed on the pixel electrode 191 exposed through the pixel opening 351, and the common electrode 270 is formed on the organic light emission layer 370. The common electrode 270 is also formed on the pixel defined layer 350 to be formed over the plurality of pixels. As described above, the organic light emitting diode OLD including the pixel electrode 191, the organic light emission layer 370, and the common electrode 270 is then formed.

Herein, the pixel electrode 191 is the anode which is a hole injection electrode, and the common electrode 270 is the cathode which is an electron injection electrode. However, the exemplary embodiment according to the present disclosure is not limited thereto, and the pixel electrode 191 may be the cathode and the common electrode 270 may be the anode according to the driving method of the organic light emitting diode display. Holes and electrons are injected from the pixel electrode 191 and the common electrode 270 into the organic light emission layer 370, respectively, and when excitons, in which the injected holes and electrons are bonded, fall from an excited state to a ground state, light is emitted.

The organic light emission layer 370 is formed of a low molecule organic material or a high molecule organic material, such as poly 3,4-ethylenedioxythiophene (PEDOT). Further, the organic light emission layer 370 may be formed in a multilayer including one or more of a light emission layer, a hole injection layer (HIL), a hole transporting layer (HTL), an electron transporting layer (ETL), and an electron injection layer (EIL). When the organic light emission layer 370 includes all of the light emission layer, the hole injection layer (HIL), the hole transporting layer (HTL), the electron transporting layer (ETL), and the electron injection layer (EIL), the hole injection layer is positioned on the pixel electrode 191, which is the anode, and the hole transporting layer, the light emission layer, the electron transporting layer, and the electron injection layer are sequentially stacked on the hole injection layer.

The organic light emission layer 370 may include a red organic light emission layer emitting red light, a green organic light emission layer emitting green light, and a blue organic light emission layer emitting blue light. The red organic light emission layer, the green organic light emission layer, and the blue organic light emission layer are formed in a red pixel, a green pixel, and a blue pixel, respectively, to implement a color image.

Further, the organic light emission layer 370 may implement the color image by stacking all of the red organic light emission layer, the green organic light emission layer, and the blue organic light emission layer in the red pixel, the green pixel, and the blue pixel together, and forming a red color filter, a green color filter, and a blue color filter for each pixel. In another example, a white organic light emission layer emitting white light may be formed in all of the red pixel, the green pixel, and the blue pixel, and the red color filter, the green color filter, and the blue color filter may be formed for each pixel to form the color image. When the color image is implemented by using the white organic light emission layer and the color filters, deposition masks for depositing the red organic light emission layer, the green organic light emission layer, and the blue organic light emission layer on the respective pixels, that is, the red pixel, the green pixel, and the blue pixel, may not be used.

The white organic light emission layer in another example may be formed of one organic light emission layer, and may include a plurality of organic light emission layers stacked to emit white light. For example, embodiments of the white organic light emission layer may also include at least one yellow organic light emission layer and at least one blue organic light emission layer combined to emit white light; at least one cyan organic light emission layer and at least one red organic light emission layer combined to emit white light; or at least one magenta organic light emission layer and at least one green organic light emission layer combined to emit white light.

A sealing member (not illustrated) for protecting the organic light emitting diode OLD may be formed on the common electrode 270, may be sealed by a sealant on the substrate 110, and may be formed of various materials, such as glass, quartz, ceramic, plastics, and metal. In the meantime, a thin film sealing layer may be formed by depositing an inorganic layer and an organic layer on the common electrode 270 without using the sealant.

A method of manufacturing the organic light emitting diode display according to the exemplary embodiment of the present disclosure will be described in detail with reference to FIGS. 8, 9, 10, 11, 12, 13, 14, 15, and 16 below.

Figure 8:
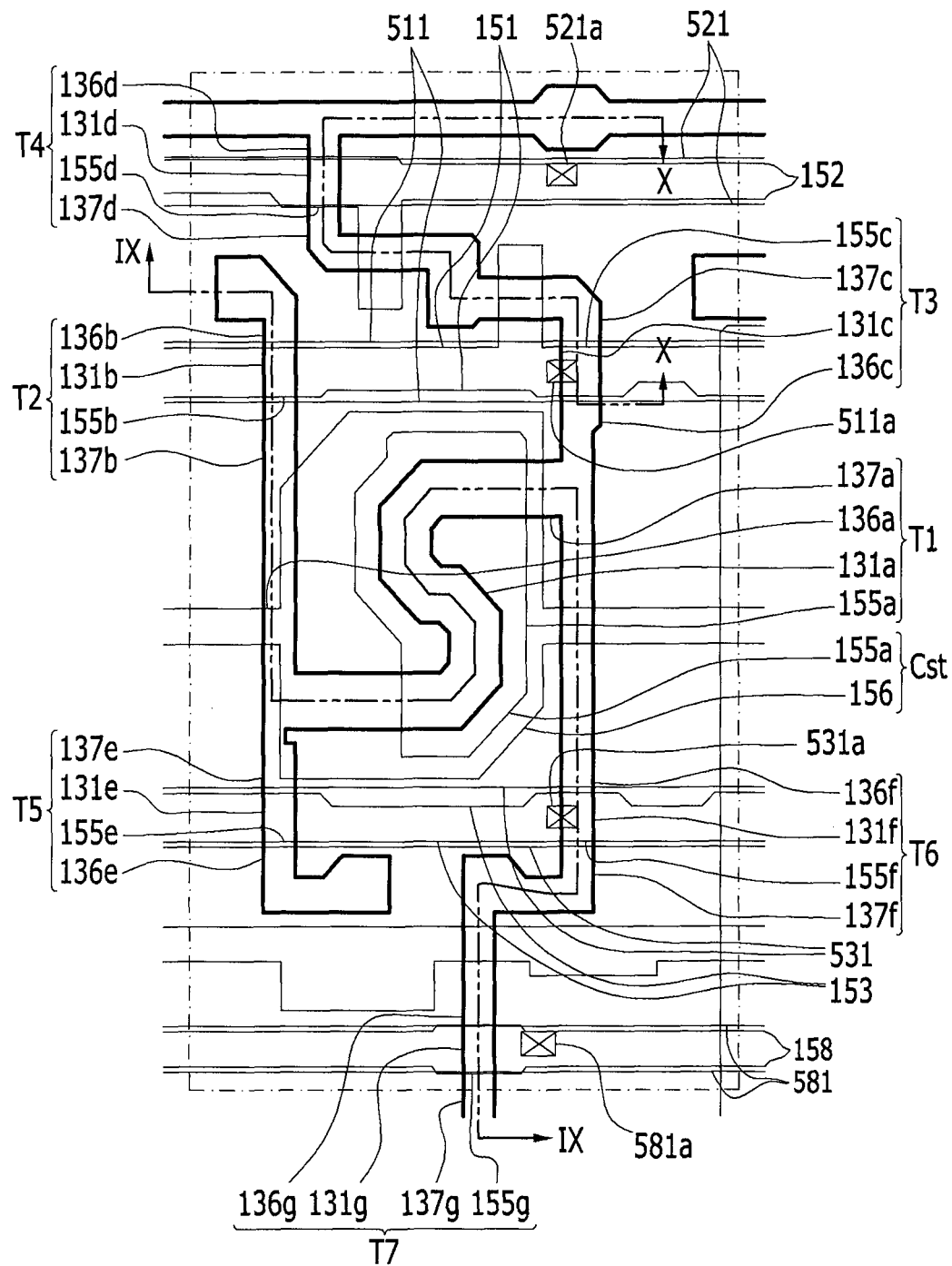
FIGS. 8, 11, and 14 are layout views sequentially illustrating a method of manufacturing the organic light emitting diode display according to the exemplary embodiment of the present disclosure.
Figure 9:
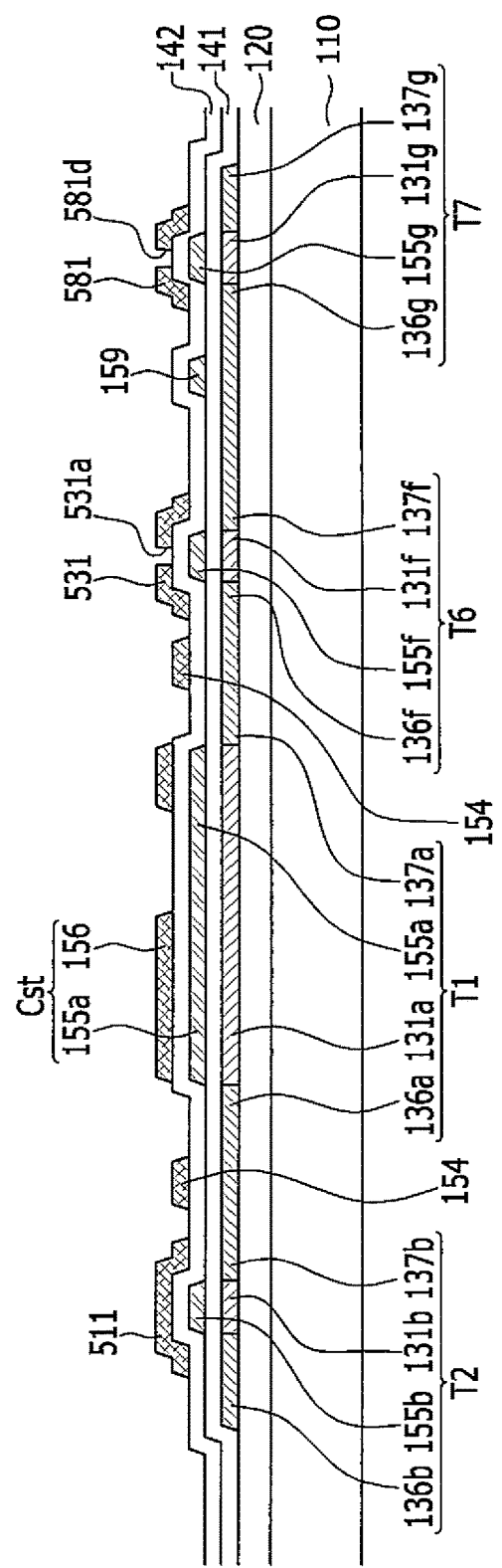
FIG. 9 is a cross-sectional view taken along line IX-IX of the organic light emitting diode display of FIG. 8.
Figure 10:
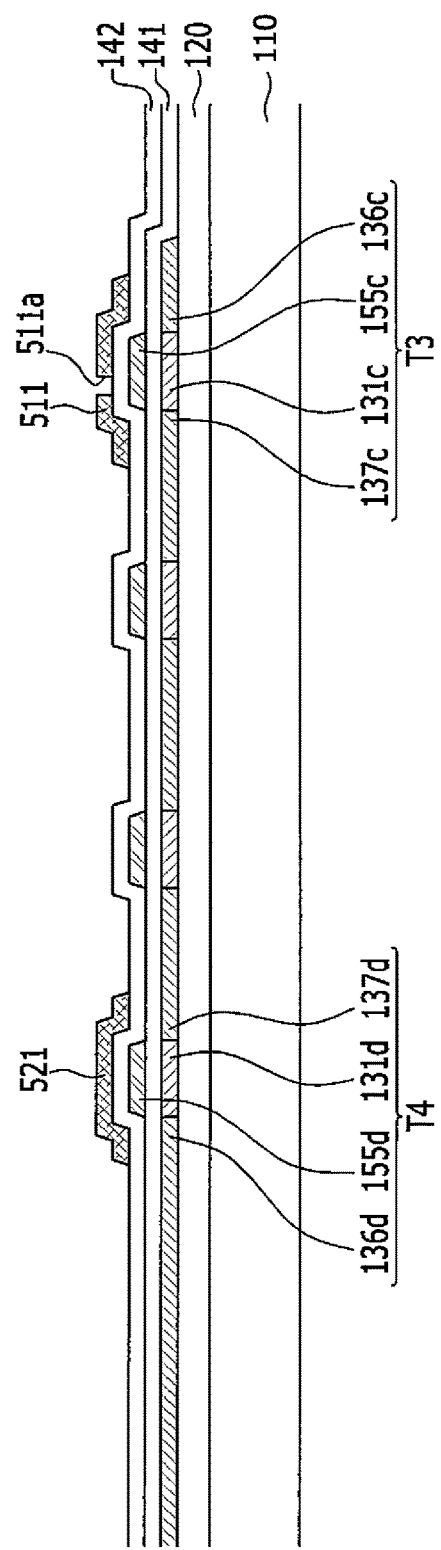
FIG. 10 is a cross-sectional view taken along line X-X line of the organic light emitting diode display of FIG. 8.
Figure 11:
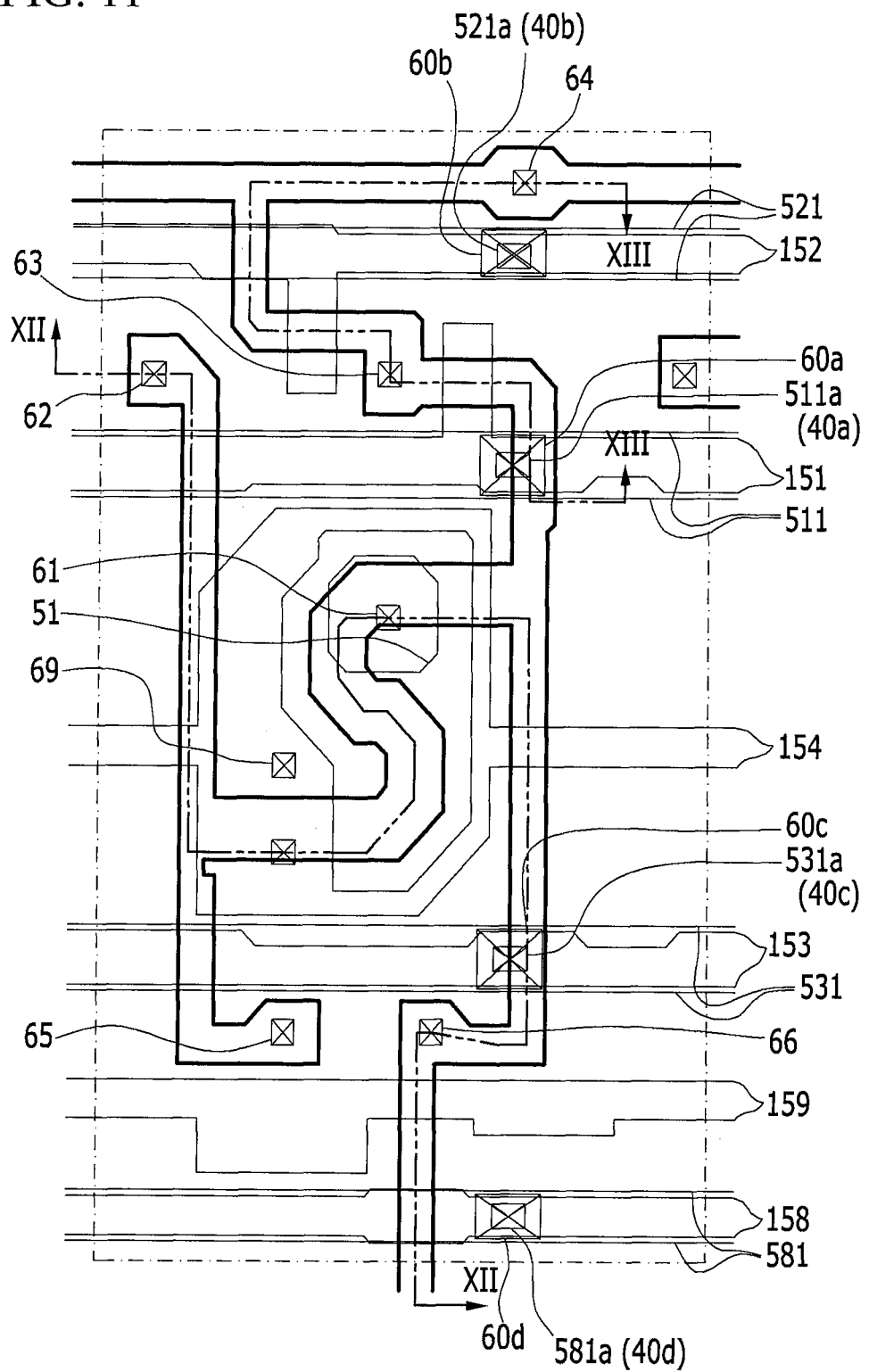
Figure 12:
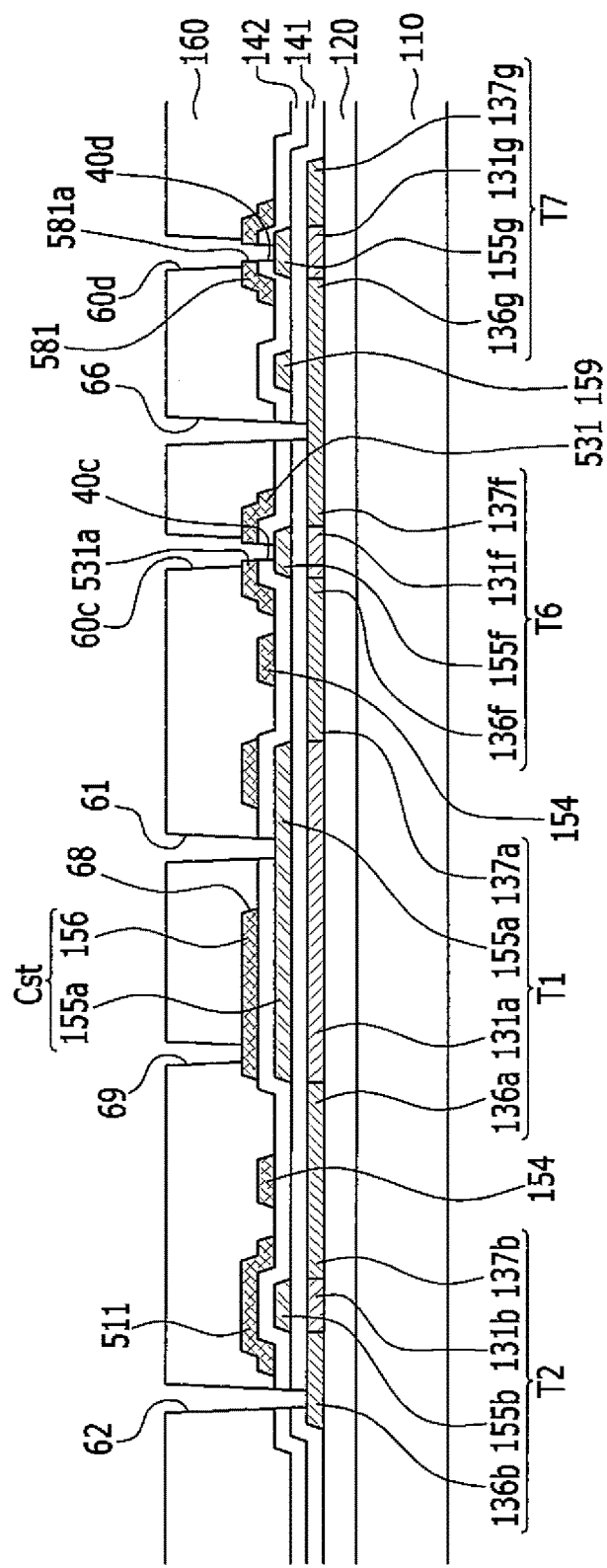
FIG. 12 is a cross-sectional view taken along line XII-XII of the organic light emitting diode display of FIG. 11.
Figure 13:
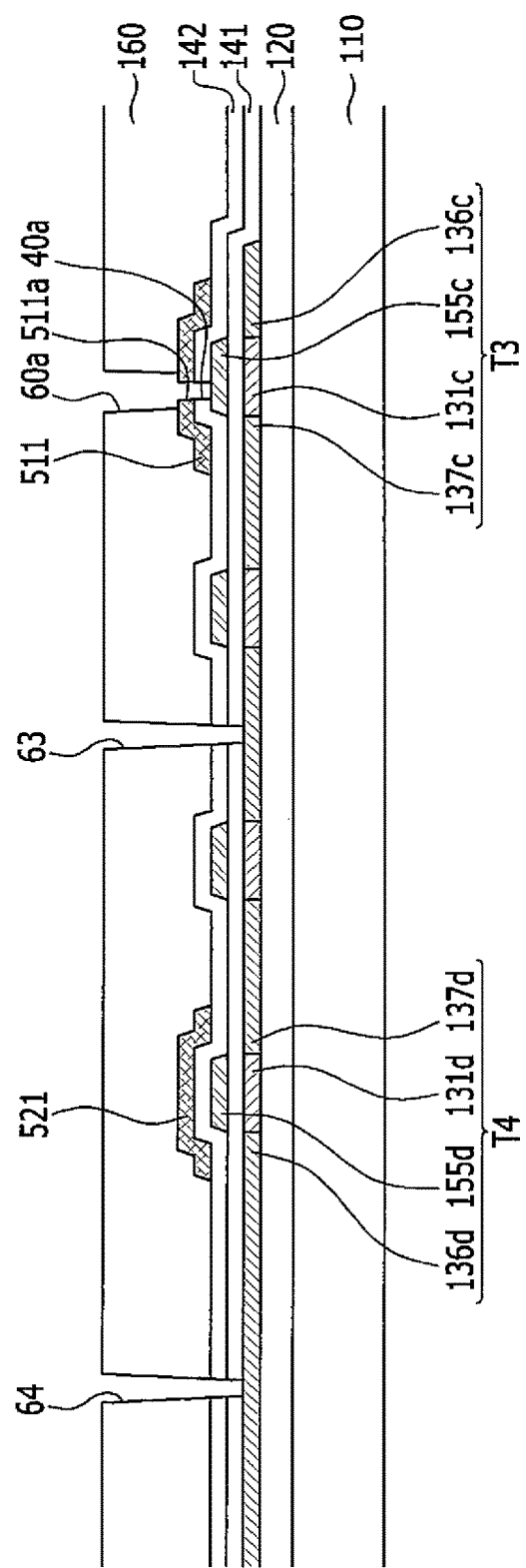
FIG. 13 is a cross-sectional view taken along line XIII-XIII of the organic light emitting diode display of FIG. 11.
Figure 14:
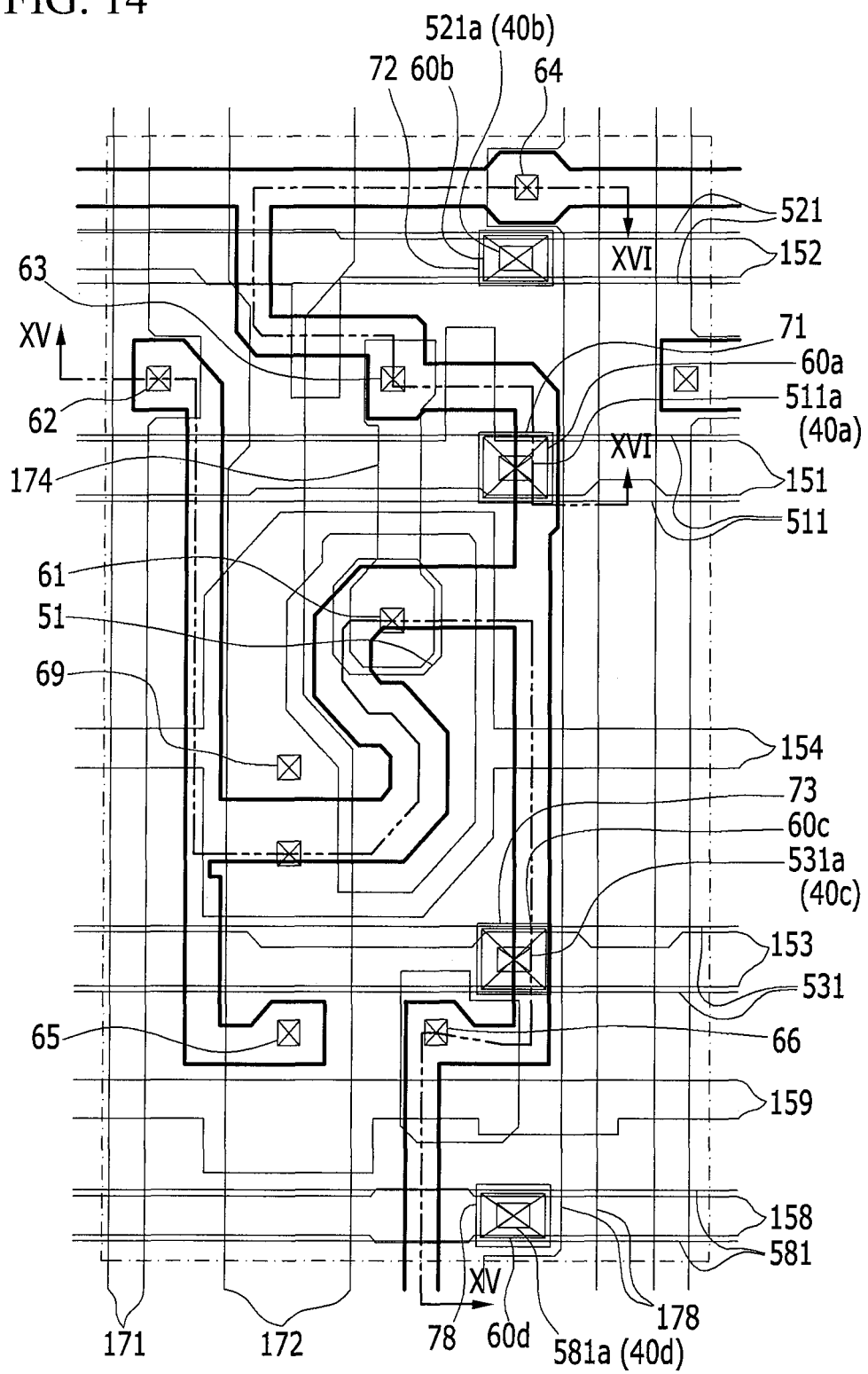
Figure 15:
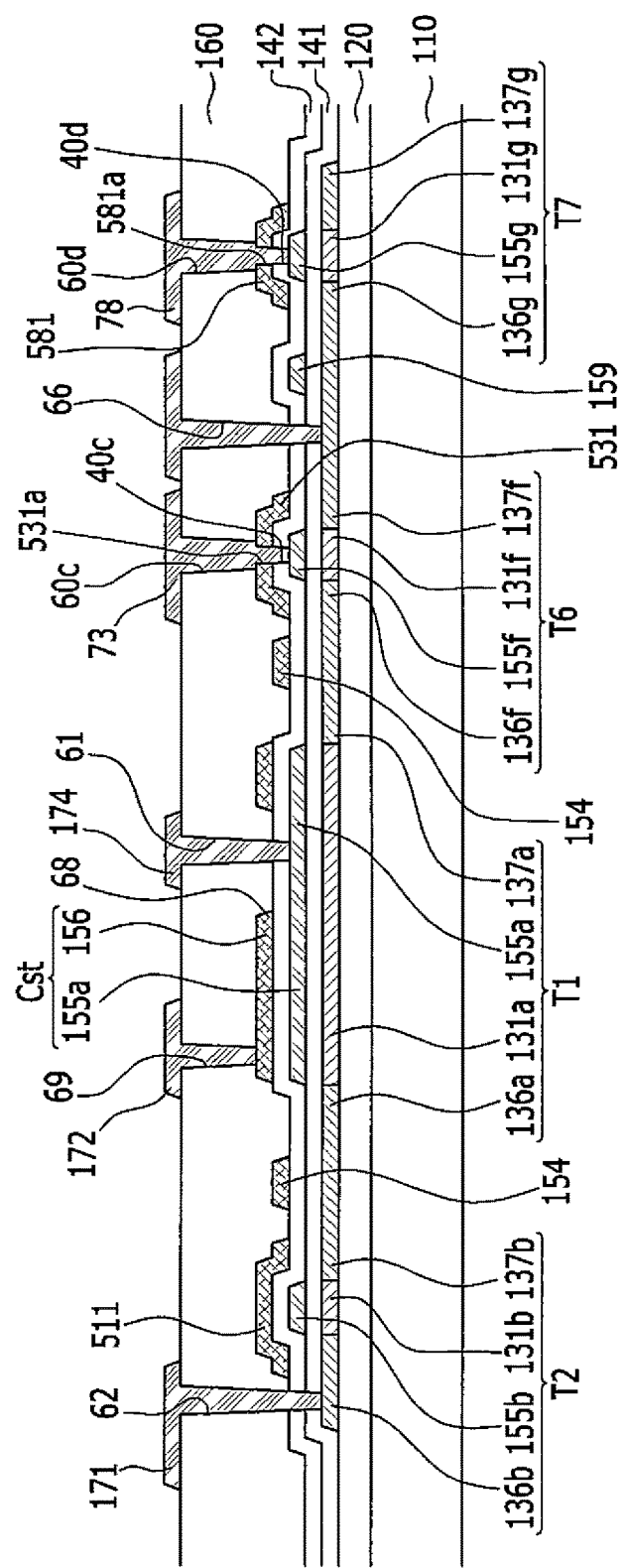
FIG. 15 is a cross-sectional view taken along line XV-XV of the organic light emitting diode display of FIG. 14.
Figure 16:
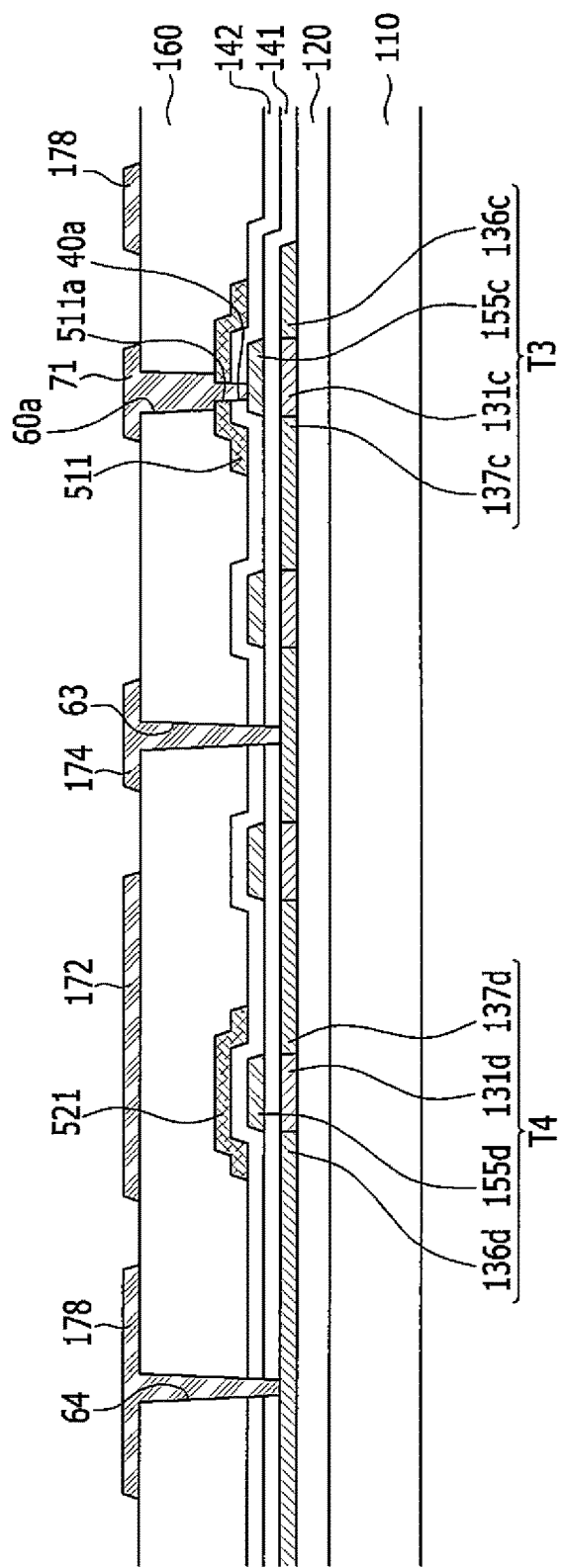
FIG. 16 is a cross-sectional view taken along line XVI-XVI of the organic light emitting diode display of FIG. 14.

FIGS. 8, 11, and 14 are layout views sequentially illustrating a method of manufacturing the organic light emitting diode display according to the exemplary embodiment of the present disclosure, FIG. 9 is a cross-sectional view taken along line IX-IX of the organic light emitting diode display of FIG. 8, FIG. 10 is a cross-sectional view taken along line X-X line of the organic light emitting diode display of FIG. 8, FIG. 12 is a cross-sectional view taken along line XII-XII of the organic light emitting diode display of FIG. 11, FIG. 13 is a cross-sectional view taken along line XIII-XIII of the organic light emitting diode display of FIG. 11, FIG. 15 is a cross-sectional view taken along line XV-XV of the organic light emitting diode display of FIG. 14, and FIG. 16 is a cross-sectional view taken along line XVI-XVI of the organic light emitting diode display of FIG. 14.

First, as illustrated in FIGS. 8, 9, and 10, the buffer layer 120 is formed on the substrate 110. The buffer layer 120 may be formed of a single layer or a staked layer of a silicon nitride and a silicon oxide, and may be deposited on a front surface of the substrate 110 by plasma chemical vapor deposition (PECVD), and the like. In addition, a semiconductor layer is formed on the buffer layer 120. The semiconductor layer may be formed of a polysilicon layer or an oxide semiconductor layer. The polysilicon layer may be formed by a method of forming an amorphous silicon layer and then crystallizing the amorphous silicon layer. Various known methods may be applied as the crystallizing method, for example, the amorphous silicon layer may be crystallized by using heat, laser, Joule heat, an electric field, a catalyst metal, or the like. In this case, the semiconductor layer is in an intrinsic semiconductor state in which the impurity is not doped. Further, the semiconductor layer is patterned into the semiconductor 130 having the form illustrated in FIG. 7 by performing a photolithography process using a first mask on the semiconductor layer. In this case, the semiconductor 130 is not doped, so that the semiconductor 130 is not divided into the channel, the source electrode, and the drain electrode configuring each transistor. Further, the semiconductor 130 is made to be in an impurity semiconductor state by performing channel doping with a low doping concentration on the semiconductor 130.

Further, the first gate insulating layer 141 covering the buffer layer 120 and the semiconductor layer 130 is formed on the buffer layer 120 and the semiconductor layer 130. The first gate insulating layer 141 is formed by depositing a silicon nitride (SiNx) or a silicon oxide ($SiO_2$) on a front surface thereof by a method of plasma chemical vapor deposition PECVD and the like. In addition, a first gate metal layer is formed on the first gate insulating layer 141. The first gate metal layer may be formed of a multilayer in which a metal layer including any one of copper (Cu), a copper alloy, aluminum (Al), an aluminum alloy, molybdenum (Mo), and a molybdenum alloy is stacked. In addition, the first gate metal layer is patterned by a photolithography process using a second mask. As a result, the first gate wires 151, 152, 153, 155a, and 158 including the scan line 151, the previous scan line 152, the light emission control line 153, the bypass control line 158, and the first storage electrode 155a that is the driving gate electrode are formed.

Further, source and drain doping having a higher doping concentration than that of the channel doping is performed on the semiconductor 130. Exposed areas of the semiconductor 130 are source and drain doped except for the parts hidden by the switching gate electrode 155b, the compensation gate electrode 155c, the initialization gate electrode 155d, the operation control gate electrode 155e, the light emission control gate electrode 155f, the bypass gate electrode 155g, and the driving gate electrode 155a, respectively. As a result, the source electrode and the drain electrode of each transistor are formed. The channel 131 of each transistor is formed in the area of the semiconductor 130 which is hidden and is not doped. That is, the driving channel 131a, the switching channel 131b, the compensation channel 131c, the initialization channel 131d, the operation control channel 131e, the light emission control channel 131f, and the bypass channel 131g are simultaneously formed. As described above, when the source and drain doping is performed on the semiconductor 130, a separate mask is not required.

Further, the second gate insulating layer 142 covering the first gate insulating layer 141 and the first gate wires 151, 152, 153, 155a, and 158 is formed on the first gate insulating layer 141 and the first gate wires 151, 152, 153, 155a, and 158. The second gate insulating layer 142 is formed by depositing a silicon nitride (SiNx) or a silicon oxide ($SiO_2$) on a front surface thereof by a method of plasma chemical vapor deposition and the like. Further, the impurity doped in the semiconductor 130 is made to be properly positioned by performing a dopant activation process, and damage in a boundary surface between the semiconductor 130 and the first gate insulating layer 141 is removed.

In addition, a second gate metal layer is formed on the second gate insulating layer 142. The second gate metal layer may be formed of a multilayer in which a metal layer including any one of copper (Cu), a copper alloy, aluminum (Al), an aluminum alloy, molybdenum (Mo), and a molybdenum alloy is stacked. In addition, the second gate metal layer is patterned by a photolithography process using a third mask. As a result, the second gate wires 511, 521, 531, 581, 154, 156, and 159 including the auxiliary scan line 511 including the auxiliary scan opening 511a, the auxiliary previous scan line 521 including the auxiliary previous scan opening 521a, the auxiliary light emission control line 531 including the auxiliary light emission control opening 531a, and the auxiliary bypass control line 581 including an auxiliary bypass opening, the storage line 154, the second storage electrode 156, and the repair line 159 are formed.

Next, as illustrated in FIGS. 11, 12, and 13, the interlayer insulating layer covering the second gate insulating layer 142 and the second gate wires 511, 521, 531, 581, 154, 156, and 159 is formed on the second gate insulating layer 142 and the second gate wires 511, 521, 531, 581, 154, 156, and 159. Further, the plurality of contact holes 61, 62, 63, 64, 65, 66, and 69, the second openings 60a, 60b, 60c, and 60d, and the first openings 40a, 40b, 40c, and 40d are simultaneously formed by simultaneously pattering the first gate insulating layer 141, the second gate insulating layer 142, and the interlayer insulating layer 160 by a photolithography process using a fourth mask. In this case, the auxiliary openings 511a, 521a, 531a, and 581a serve as an etching preventing layer, so that the boundary lines of the first openings 40a, 40b, 40c, and 40d formed in the second gate insulating layer 142 formed under the auxiliary signal lines 511, 521, 531, and 581 are the same as the boundary lines of the auxiliary openings 511a, 521a, 531a, and 581a.

As described above, since the first openings 40a, 40b, 40c, and 40d and the second opening 60a, 60b, 60c, and 60d may be simultaneously formed by a photolithography process using the fourth mask, a separate mask for forming the first openings is not required, thereby reducing a manufacturing process and decreasing manufacturing cost.

Next, as illustrated in FIGS. 14, 15, and 16, a data metal layer is formed on the interlayer insulating layer 160. The data metal layer may be formed of a multilayer in which a metal layer including any one of copper, a copper alloy, aluminum, an aluminum alloy, molybdenum, and a molybdenum alloy is stacked. For example, the data metal layer may be formed of triple layers of titanium/aluminum/titanium (Ti/Al/Ti), molybdenum/aluminum/molybdenum (Mo/Al/Mo), or molybdenum/copper/molybdenum (Mo/Cu/Mo).

Then, the data metal layer is patterned by a photolithography process using a fifth mask. Accordingly, the data wires 171, 172, 174, 178, 179, 71, 72, 73, and 78 including the data line 171, the driving voltage line 172, the driving connecting member 174, the initialization voltage line 178, the light emission control connecting member 179, and the first signal line connecting members 71, 72, 73, and 78 are formed on the interlayer insulating layer 160.

The first signal line connecting members 71, 72, 73, and 78 are formed in the second openings 60a, 60b, 60c, and 60d, the auxiliary openings 511a, 521a, 531a, and 581a, and the first openings 40a, 40b, 40c, and 40d to connect the first signal lines 151, 152, 153, and 158 and the auxiliary signal lines 511, 521, 531, and 581 to each other.

Next, as illustrated in FIGS. 1, 2, 3, 4, 5, 6, and 7, the passivation layer 180 covering the interlayer insulating layer 160 and the data wires 171, 172, 174, 178, 179, 71, 72, 73, and 78 is formed on the interlayer insulating layer 160 and the data wires 171, 172, 174, 178, 179, 71, 72, 73, and 78, and the contact hole 81 is formed in the passivation layer 180 by a photolithography process using a sixth mask. Further, a pixel electrode layer is formed on the passivation layer 180, and the pixel electrode layer is patterned by a photolithography process using a seventh mask. Accordingly, the pixel electrode 191 connected with the light emission connecting member 179 through the contact hole 81 is formed on the passivation layer 180. Then, the pixel defined layer 350 covering the pixel electrode 191 is formed on the protective layer 180, and the pixel opening 351 for exposing of a portion of the pixel electrode 191 is formed in the pixel defined layer 350 by using an eighth mask. Then, the organic light emission layer 370 is formed on the pixel electrode 191 exposed through the pixel opening 351 of the pixel defined layer 350. Then, the organic light emitting diode OLD is completed by forming the common electrode 270 on the organic light emission layer 370. The common electrode 270 is formed over the entire area including an upper portion of the pixel defined layer 350, so that a separate mask is not used. The manufacturing method of forming from the semiconductor 130 to the common electrode 270 by using the total of eight masks described above is called an eight mask process, and a structure of the organic light emitting diode display manufactured by the eight mask process is called an eight mask structure.

In the exemplary embodiment, the auxiliary opening is formed in the auxiliary signal line, but in another exemplary embodiment, the auxiliary signal line may be divided into a first sub auxiliary signal line and a second sub auxiliary signal line by a spacing part.

Figure 17:
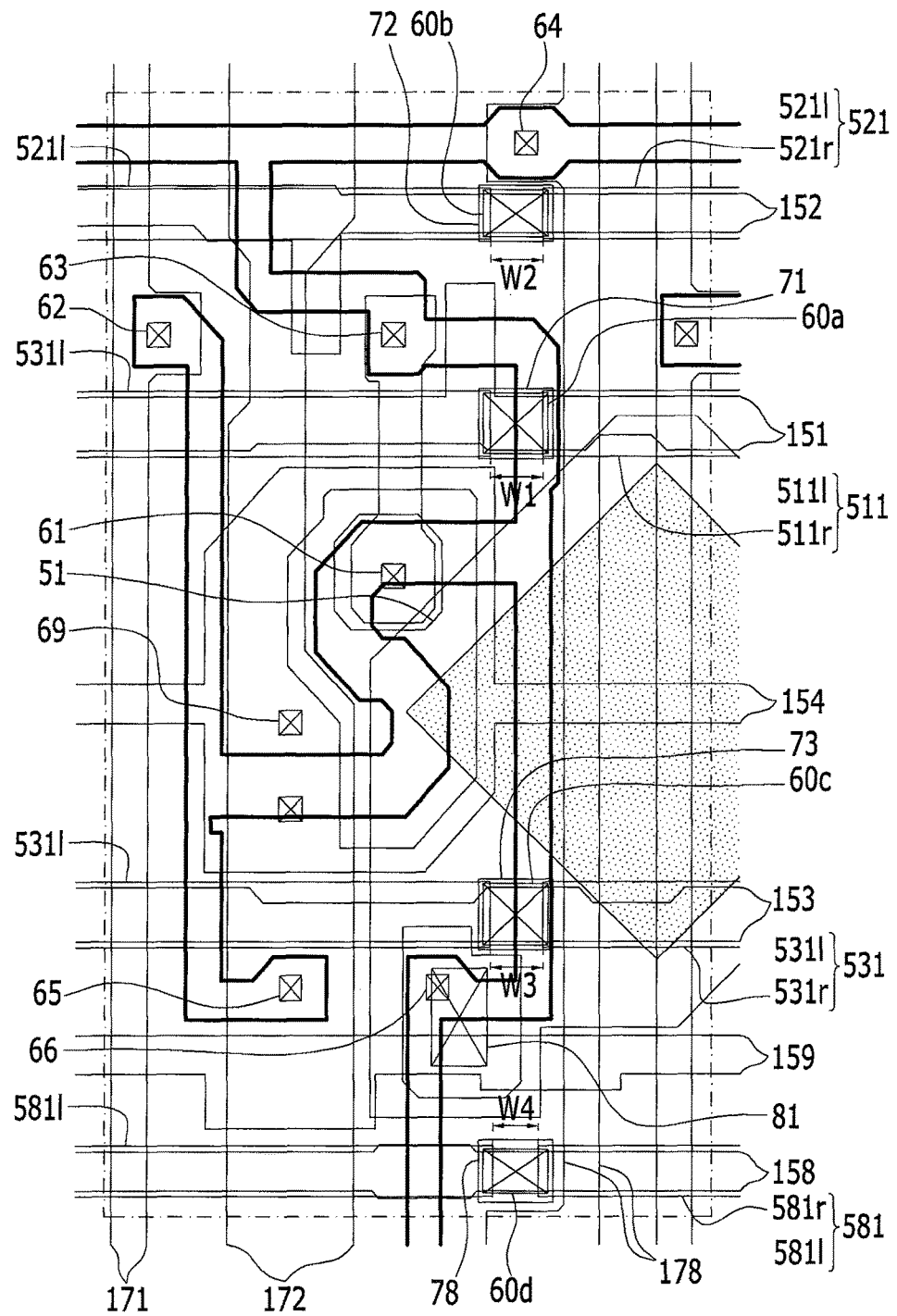
FIG. 17 is a layout view of an organic light emitting diode display according to another exemplary embodiment of the present disclosure.

FIG. 17 is a layout view of an organic light emitting diode display according to another exemplary embodiment of the present disclosure.

Another exemplary embodiment of the present disclosure illustrated in FIG. 17 is substantially the same as the exemplary embodiments of the present disclosure illustrated in FIGS. 1, 2, 3, 4, 5, 6, an 7 except that an auxiliary signal line is divided into a first sub auxiliary signal line and a second sub auxiliary signal line by a spacing part, so that repeated descriptions will be omitted.

As illustrated in FIG. 17, the organic light emitting diode display according to another exemplary embodiment of the present disclosure includes auxiliary signal lines 511, 521, 531, and 581 overlapping first signal lines 151, 152, 153, and 158. The auxiliary signal lines 511, 521, 531, and 581 are divided into first auxiliary signal lines 511l, 521l, 531l, and 581l and second auxiliary signal lines 511r, 521r, 531r, and 581r by spacing parts w1, w2, w3, and w4. That is, an auxiliary scan line 511 is divided into a first auxiliary scan line 511l and a second auxiliary scan line 511r by a scan spacing part w1, an auxiliary previous scan line 521 is divided into a first auxiliary previous scan line 521l and a second auxiliary previous scan line 521r by a previous scan spacing part w2, an auxiliary light emission control line 531 is divided into a first auxiliary light emission control line 531l and a second auxiliary light emission control line 531r by a light emission control spacing part w3, and an auxiliary bypass control line 581 is divided into a first auxiliary bypass control line 581l and a second auxiliary bypass control line 581r by a bypass control spacing part w4.

Further, the spacing parts w1, w2, w3, and w4 overlap the first signal line connecting members 71, 72, 73, and 78 and the first signal lines 151, 152, 153, and 158. Accordingly, the first signal line connecting members 71, 72, 73, and 78 connect the first signal lines 151, 152, 153, and 158 and the auxiliary signal lines 511, 521, 531, and 581 to each other through the second openings 60a, 60b, 60c, and 60d formed in an interlayer insulating layer 160, the spacing parts w1, w2, w3, and w4, and the first openings 40a, 40b, 40c, and 40d formed in a second gate insulating layer 142, so that it is possible to easily implement a high resolution structure by reducing resistance of the first signal lines 151, 152, 153, and 158.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the present invention, as defined by the appended claims.

Description of symbols

| | |
|---|---|
| 141: First gate insulating layer | 142: Second gate insulating layer |
| 151: Scan line | 155a: Driving gate electrode |
| 155b: Switching gate electrode | 160: Interlayer insulating layer |
| 171: Data line | 172: Driving voltage line |
| 174: Driving connecting member | |
| 179: Light emission control connecting member | |

-continued

Description of symbols 511, 521, 531, 581: Auxiliary signal line
71, 72, 73, 78: First signal line connecting member
40a, 40b, 40c, 40d: First opening
511a, 521a, 531a, 581a: Auxiliary opening
60a, 60b, 60c, 60d: Second opening
w1, w2, w3, w4: Spacing part

What is claimed is:

1. An organic light emitting diode display, comprising:
a substrate;
a plurality of first signal lines formed on the substrate and extended in a first direction;
a first insulating layer configured to cover the substrate and the plurality of first signal lines;
a plurality of auxiliary signal lines formed on the first insulating layer, extended in the first direction and overlapping the plurality of first signal lines;
a second insulating layer configured to cover the plurality of auxiliary signal lines;
a plurality of first signal line connecting members formed on the second insulating layer and overlapping parts of the plurality of auxiliary signal lines;
a plurality of second signal lines crossing the plurality of first signal lines;
a plurality of switching transistors and a plurality of driving transistors connected to the plurality of first signal lines and the plurality of second signal lines; and
a plurality of organic light emitting diodes electrically connected with the plurality of driving transistors,
wherein the plurality of first signal line connecting members connect the first signal lines to the auxiliary signal lines, respectively.

2. The organic light emitting diode display of claim 1, wherein:
each of the plurality of auxiliary signal lines includes an auxiliary opening overlapping a respective first signal line connecting member,
the first insulating layer includes a plurality of first openings for exposing a part of the plurality of first signal lines, respectively,
the second insulating layer includes a plurality of second openings for exposing a part of the plurality of auxiliary signal lines and the auxiliary openings, respectively, and
each of the first signal line connecting members connects the respective first signal line to a respective auxiliary signal line through a respective first opening, a respective auxiliary opening, and a respective second opening.

3. The organic light emitting diode display of claim 2, wherein a boundary line of the first opening corresponds to a boundary line of the auxiliary openings.

4. The organic light emitting diode display of claim 2, wherein a diameter of each of the second openings is larger than a diameter of each of the first openings.

5. The organic light emitting diode display of claim 2, wherein each of the second openings exposes the entire of the respective auxiliary opening.

6. The organic light emitting diode display of claim 2, wherein the first signal lines and the auxiliary signal lines are elongated in the same direction.

7. The organic light emitting diode display of claim 2, wherein the driving transistors includes:
a driving channel formed on the substrate;
a driving gate electrode formed on the driving channel and overlapping the driving channel; and
a driving source electrode and a driving drain electrode positioned at both sides of the driving channel, wherein the driving channel is bent on a plane.

8. The organic light emitting diode display of claim 7, further comprising for each of the driving transistors:
a storage capacitor including a first storage electrode formed on the same layer as that of the first signal lines; and
a second storage electrode overlapping the first storage electrode and formed on the first insulating layer,
wherein the first storage electrode is a driving gate electrode.

9. The organic light emitting diode display of claim 2, wherein each of the first signal lines includes:
a scan line which is formed on the substrate and transmits a scan signal; a previous scan line which is disposed in parallel to the scan line to transmit a previous scan signal and formed on the same layer as that of the scan line; a light emission control line which is disposed in parallel to the scan line to transmit a light emission control signal, and formed on the same layer as that of the scan line; and a bypass control line which is disposed in parallel to the scan line to transmit a bypass control signal, and formed on the same layer as that of the scan line, and wherein each of the auxiliary signal lines includes:
an auxiliary scan line formed on the first insulating layer and overlapping the scan line; an auxiliary previous scan line formed on the first insulating layer and overlapping the previous scan line; an auxiliary light emission control line formed on the first insulating layer and overlapping the light emission control line; and an auxiliary bypass control line formed on the first insulating layer and overlapping the bypass control line.

10. The organic light emitting diode display of claim 9, wherein each of the first signal line connecting members includes:
a scan connecting member formed on the second insulating layer and overlapping a part of the respective auxiliary scan line; a previous scan connecting member formed on the second insulating layer and overlapping a part of the respective auxiliary previous scan line, a light emission control connecting member formed on the second insulating layer and overlapping a part of the respective auxiliary light emission control line; and a bypass control connecting member formed on the second insulating layer and overlapping a part of the respective auxiliary bypass control line, and wherein each of the auxiliary openings includes: an auxiliary scan opening formed in the respective auxiliary scan line, an auxiliary previous scan opening formed in the respective auxiliary previous scan line, an auxiliary light emission control opening formed in the respective auxiliary light emission control line, and an auxiliary bypass control opening formed in the respective auxiliary bypass control line.

11. The organic light emitting diode display of claim 10, wherein each of the first openings includes: a first scan opening for exposing a part of the scan line; a first previous scan opening for exposing a part of the respective previous scan line; a first light emission control opening for exposing a part of the respective light emission control line; and a first bypass control opening for exposing a part of the respective bypass control line, and wherein each of the second openings includes: a second scan opening for exposing the respective auxiliary scan opening; a second previous scan opening for exposing the respective auxiliary previous scan opening; a second light emission control opening for exposing the respective auxiliary light emission control opening, and a second bypass opening for exposing the respective auxiliary bypass control opening.

12. The organic light emitting diode display of claim 1, wherein each of the auxiliary signal lines includes a first auxiliary signal line and a second auxiliary signal line separated from each other by a spacing part,
- the first insulating layer includes a first opening for exposing a part of the first signal line,
- the second insulating layer includes a second opening for exposing the spacing part between an end of the first auxiliary signal line and an end of the second auxiliary signal line, and
- the first signal line connecting member connects the first signal line and the auxiliary signal line to each other through the first opening, the spacing part, and the second opening.

* * * * *